(12) United States Patent
Rust et al.

(10) Patent No.: US 7,379,412 B2
(45) Date of Patent: May 27, 2008

(54) METHODS FOR WRITING AND READING HIGHLY RESOLVED DOMAINS FOR HIGH DENSITY DATA STORAGE

(75) Inventors: Thomas F. Rust, Oakland, CA (US); Robert N. Stark, Saratoga, CA (US); Thomas L. Noggle, Oakland, CA (US); Daniel F. Cribbs, Los Gatos, CA (US)

(73) Assignee: Nanochip, Inc., Fremont, CA (US)

( * ) Notice: Subject to any disclaimer, the term of this patent is extended or adjusted under 35 U.S.C. 154(b) by 704 days.

(21) Appl. No.: 11/004,153

(22) Filed: Dec. 3, 2004

(65) Prior Publication Data

US 2005/0243659 A1 Nov. 3, 2005

Related U.S. Application Data

(60) Provisional application No. 60/563,123, filed on Apr. 16, 2004.

(51) Int. Cl.
*G11B 9/00* (2006.01)
(52) U.S. Cl. ........................... 369/126; 369/288
(58) Field of Classification Search .............. None
See application file for complete search history.

(56) References Cited

U.S. PATENT DOCUMENTS

| | | | | |
|---|---|---|---|---|
| 4,340,953 A | 7/1982 | Iwamura et al. | ............ | 369/126 |
| 4,575,822 A | 3/1986 | Quate | ............ | 365/174 |
| 4,710,899 A | 12/1987 | Young et al. | ............ | 365/113 |
| 4,719,594 A | 1/1988 | Young et al. | ............ | 365/113 |
| 4,737,934 A | 4/1988 | Ross et al. | ............ | 365/106 |
| 4,744,055 A | 5/1988 | Hennessey | ............ | 365/113 |
| 4,769,338 A | 9/1988 | Ovshinsky | ............ | 437/39 |
| 4,769,682 A | 9/1988 | Yang et al. | ............ | 357/2 |
| 4,775,425 A | 10/1988 | Guha et al. | ............ | 136/249 |
| 4,792,501 A | 12/1988 | Allred et al. | ............ | 428/699 |

(Continued)

FOREIGN PATENT DOCUMENTS

EP 0 438 256 B1 7/1991

(Continued)

OTHER PUBLICATIONS

International Search Report for PCT/US05/12788 dated Oct. 20, 2006, 10 pages.

(Continued)

*Primary Examiner*—Paul W. Huber
(74) *Attorney, Agent, or Firm*—Fliesler Meyer LLP

(57) ABSTRACT

Methods in accordance with the present invention can be applied, in an embodiment, to a media comprising a phase change material to alter a resolved portion of the phase change material to have a resistance different from a resistance of the bulk material. A tip having a substantially larger radius of curvature than the resolved portion can be employed by applying such methods. A substantially anisotropic columnar material can focus a current applied between the tip and the media so that the portion is narrower in width than the radius of curvature. Such highly resolved portions form bits in the media. Other objects, aspects and advantages of the invention can be obtained from reviewing the figures, specification and claims. This description is not intended to be a complete description of, or limit the scope of, the invention.

80 Claims, 24 Drawing Sheets

U.S. PATENT DOCUMENTS

| | | | |
|---|---|---|---|
| 4,820,394 A | 4/1989 | Young et al. | 204/192.21 |
| 4,829,507 A | 5/1989 | Kazan et al. | 369/126 |
| 4,831,614 A | 5/1989 | Duerig et al. | 369/101 |
| 4,843,443 A | 6/1989 | Ovshinsky et al. | 357/23.7 |
| 4,845,533 A | 7/1989 | Pryor et al. | 357/2 |
| 4,868,616 A | 9/1989 | Johnson et al. | 357/17 |
| 4,876,667 A | 10/1989 | Ross et al. | 365/113 |
| 4,882,295 A | 11/1989 | Czubatyj et al. | 437/101 |
| 4,883,686 A | 11/1989 | Doehler et al. | 427/38 |
| 4,891,330 A | 1/1990 | Guha et al. | 437/81 |
| 4,916,002 A | 4/1990 | Carver | 428/139 |
| 4,916,688 A | 4/1990 | Foster et al. | 369/126 |
| 4,924,436 A | 5/1990 | Strand | 365/113 |
| 4,945,515 A | 7/1990 | Ooumi et al. | 365/174 |
| 4,962,480 A | 10/1990 | Ooumi et al. | 365/151 |
| 4,968,585 A | 11/1990 | Albrecht et al. | 430/320 |
| 4,987,312 A | 1/1991 | Eigler | 250/492.3 |
| 5,008,617 A | 4/1991 | Czubatyj et al. | 324/158 |
| 5,038,322 A | 8/1991 | Van Loenen | 365/114 |
| 5,043,578 A | 8/1991 | Guethner et al. | 250/307 |
| 5,051,977 A | 9/1991 | Goldberg | 369/126 |
| 5,091,880 A | 2/1992 | Isono et al. | 365/151 |
| 5,095,479 A | 3/1992 | Harigaya et al. | 369/288 |
| 5,097,443 A | 3/1992 | Kaneko et al. | 365/153 |
| 5,103,284 A | 4/1992 | Ovshinsky et al. | 357/60 |
| 5,126,635 A | 6/1992 | Doehler et al. | 315/111.21 |
| 5,128,099 A | 7/1992 | Strand et al. | 420/579 |
| 5,144,148 A | 9/1992 | Eigler | 250/492.3 |
| 5,159,661 A | 10/1992 | Ovshinsky et al. | 395/24 |
| 5,166,758 A | 11/1992 | Ovshinsky et al. | 257/3 |
| 5,177,567 A | 1/1993 | Klersy et al. | 257/4 |
| 5,180,686 A | 1/1993 | Banerjee et al. | 437/181 |
| 5,180,690 A | 1/1993 | Czubatyj et al. | 437/233 |
| 5,187,367 A | 2/1993 | Miyazaki et al. | 250/603 |
| 5,196,701 A | 3/1993 | Foster et al. | 250/306 |
| 5,216,631 A | 6/1993 | Sliwa, Jr. | 365/174 |
| 5,223,308 A | 6/1993 | Doehler | 427/575 |
| 5,231,047 A | 7/1993 | Ovshinsky et al. | 437/101 |
| 5,251,200 A | 10/1993 | Hatanaka et al. | 369/126 |
| 5,260,567 A | 11/1993 | Kuroda et al. | 250/227.19 |
| 5,262,981 A | 11/1993 | Rabe et al. | 365/120 |
| 5,265,046 A | 11/1993 | Fuchs et al. | 365/151 |
| 5,289,455 A | 2/1994 | Kuroda et al. | 369/126 |
| 5,296,716 A | 3/1994 | Ovshinsky et al. | 257/3 |
| 5,307,311 A | 4/1994 | Sliwa, Jr. | 365/174 |
| 5,323,375 A | 6/1994 | Ihara et al. | 369/126 |
| 5,324,553 A | 6/1994 | Ovshinsky et al. | 427/571 |
| 5,330,630 A | 7/1994 | Klersy et al. | 204/192.05 |
| 5,335,197 A | 8/1994 | Kaneko et al. | 365/153 |
| 5,341,328 A | 8/1994 | Ovshinsky et al. | 365/163 |
| 5,359,205 A | 10/1994 | Ovshinsky et al. | 257/3 |
| 5,389,475 A | 2/1995 | Yanagisawa et al. | 430/19 |
| 5,406,509 A | 4/1995 | Ovshinsky et al. | 365/113 |
| 5,411,591 A | 5/1995 | Izu et al. | 118/718 |
| 5,412,597 A | 5/1995 | Miyazaki et al. | 365/174 |
| 5,414,271 A | 5/1995 | Ovshinsky et al. | 257/3 |
| 5,426,092 A | 6/1995 | Ovshinsky et al. | 505/461 |
| 5,439,777 A | 8/1995 | Kawada et al. | 430/270 |
| 5,446,684 A | 8/1995 | Kaneko et al. | 365/46 |
| 5,453,970 A | 9/1995 | Rust et al. | 369/176 |
| 5,471,064 A | 11/1995 | Koyanagi et al. | 250/452.2 |
| 5,471,458 A | 11/1995 | Oguchi et al. | 369/126 |
| 5,534,711 A | 7/1996 | Ovshinsky et al. | 257/3 |
| 5,534,712 A | 7/1996 | Ovshinsky et al. | 217/3 |
| 5,536,947 A | 7/1996 | Klersy et al. | 257/3 |
| 5,537,372 A | 7/1996 | Albrecht et al. | 369/43 |
| 5,543,737 A | 8/1996 | Ovshinsky | 326/104 |
| 5,557,596 A | 9/1996 | Gibson et al. | 369/101 |
| 5,561,300 A | 10/1996 | Wada et al. | 250/492.2 |
| 5,562,776 A | 10/1996 | Sapru et al. | 118/723 |
| 5,567,241 A | 10/1996 | Tsu et al. | 118/723 |
| 5,591,501 A | 1/1997 | Ovshinsky et al. | 428/64.1 |
| 5,596,522 A | 1/1997 | Ovshinsky et al. | 365/113 |
| 5,597,411 A | 1/1997 | Fritzsche et al. | 117/104 |
| 5,606,162 A | 2/1997 | Buser et al. | 250/306 |
| 5,670,224 A | 9/1997 | Izu et al. | 428/35.8 |
| 5,679,952 A | 10/1997 | Lutwyche et al. | 250/306 |
| 5,687,112 A | 11/1997 | Ovshinsky | 365/163 |
| 5,694,054 A | 12/1997 | Ovshinsky et al. | 326/35 |
| 5,694,146 A | 12/1997 | Ovshinsky et al. | 345/91 |
| 5,714,768 A | 2/1998 | Ovshinsky et al. | 257/40 |
| 5,751,685 A | 5/1998 | Yi | 369/126 |
| 5,757,446 A | 5/1998 | Ovshinsky et al. | 349/49 |
| 5,777,977 A | 7/1998 | Fujiwara et al. | 369/126 |
| 5,778,134 A | 7/1998 | Sakai et al. | 386/46 |
| 5,801,472 A | 9/1998 | Wada et al. | 310/309 |
| 5,804,710 A | 9/1998 | Mamin et al. | 73/105 |
| 5,808,973 A | 9/1998 | Tanaka | 369/14 |
| 5,822,285 A | 10/1998 | Rugar et al. | 369/44.26 |
| 5,825,046 A | 10/1998 | Czubatyj | 257/2 |
| 5,835,477 A | 11/1998 | Binning et al. | 369/126 |
| 5,848,077 A | 12/1998 | Kamae et al. | 371/53 |
| 5,856,967 A | 1/1999 | Mamin et al. | 369/126 |
| 5,912,839 A | 6/1999 | Ovshinsky et al. | 365/185.03 |
| 5,929,438 A | 7/1999 | Suzuki et al. | 250/306 |
| 5,933,365 A | 8/1999 | Klersy et al. | 365/148 |
| 5,953,306 A | 9/1999 | Yi | 369/126 |
| 6,001,519 A | 12/1999 | Yang et al. | 430/20 |
| 6,027,951 A | 2/2000 | MacDonald et al. | 438/20 |
| 6,028,393 A | 2/2000 | Izu | 315/111.01 |
| 6,038,916 A | 3/2000 | Cleveland et al. | 73/105 |
| 6,075,719 A | 6/2000 | Lowrey | 365/148 |
| 6,084,849 A | 7/2000 | Durig et al. | 369/126 |
| 6,087,580 A | 7/2000 | Ovshinsky | 136/261 |
| 6,087,674 A | 7/2000 | Ovshinsky | 257/2 |
| 6,101,164 A | 8/2000 | Kado et al. | |
| 6,141,241 A | 10/2000 | Ovshinsky | 365/163 |
| 6,186,090 B1 | 2/2001 | Dotter, II | 118/718 |
| 6,196,061 B1 | 3/2001 | Adderton et al. | 73/105 |
| 6,245,280 B1 | 6/2001 | Tan et al. | 264/430 |
| RE37,259 E | 7/2001 | Ovshinsky | |
| 6,275,410 B1 | 8/2001 | Morford | 365/151 |
| 6,314,014 B1 | 11/2001 | Lowrey | 365/100 |
| 6,339,217 B1 | 1/2002 | Kley | 250/216 |
| 6,366,340 B1 | 4/2002 | Ishibashi et al. | 355/69 |
| 6,369,400 B1 | 4/2002 | Haeberle et al. | 250/548 |
| 6,452,891 B1 | 9/2002 | Hennessey | 369/116 |
| 6,463,874 B1 | 10/2002 | Dotter, II et al. | 118/723 |
| 6,480,438 B1 | 11/2002 | Park | 365/260.06 |
| 6,487,113 B1 | 11/2002 | Park | 365/163 |
| 6,507,552 B2 | 1/2003 | Gibson | 369/126 |
| 6,511,862 B2 | 1/2003 | Hudgens | 438/95 |
| 6,511,867 B2 | 1/2003 | Lowrey | 438/128 |
| 6,522,566 B2 | 2/2003 | Carter | 365/118 |
| 6,531,373 B2 | 3/2003 | Gill | 438/400 |
| 6,534,781 B2 | 3/2003 | Dennison | 257/5 |
| 6,542,400 B2 | 4/2003 | Chen et al. | 365/151 |
| 6,545,907 B1 | 4/2003 | Lowrey et al. | 365/163 |
| 6,563,164 B2 | 5/2003 | Lowrey et al. | 257/314 |
| 6,566,700 B2 | 5/2003 | Xu | 257/296 |
| 6,567,293 B1 | 5/2003 | Lowrey et al. | 365/100 |
| 6,567,296 B1 | 5/2003 | Casagrande et al. | 265/105 |
| 6,570,784 B2 | 5/2003 | Lowrey | 365/163 |
| 6,589,714 B2 | 7/2003 | Maimon | 430/313 |
| 6,593,176 B2 | 7/2003 | Dennison | 438/200 |
| 6,608,773 B2 | 8/2003 | Lowrey | 365/100 |
| 6,613,604 B2 | 9/2003 | Maimon | 438/95 |
| 6,617,192 B1 | 9/2003 | Lowrey | 438/95 |
| 6,621,095 B2 | 9/2003 | Chiang | 257/5 |
| 6,646,297 B2 | 11/2003 | Dennison | 257/296 |
| 6,647,766 B2 | 11/2003 | Despont et al. | 73/105 |
| 6,667,900 B2 | 12/2003 | Lowrey | 365/171 |
| 6,671,710 B2 | 12/2003 | Ovshinsky | 708/493 |
| 6,673,700 B2 | 1/2004 | Dennison | 438/466 |

| 6,696,355 B2 | 2/2004 | Dennison ............... 438/597 |
| 6,723,421 B2 | 4/2004 | Ovshinsky ............ 428/315.7 |
| 6,733,956 B2 | 5/2004 | Maimon ................. 430/314 |
| 2002/0101573 A1 | 8/2002 | Ishibashi et al. |
| 2002/0110074 A1 | 8/2002 | Gibson |
| 2002/0135917 A1 | 9/2002 | Davidson |
| 2003/0007443 A1 | 1/2003 | Nickel |
| 2003/0081532 A1 | 5/2003 | Gibson |
| 2003/0185139 A1 | 10/2003 | Ives |
| 2003/0189200 A1 | 10/2003 | Lee et al. |

FOREIGN PATENT DOCUMENTS

| EP | 0 734 017 B1 | 9/1996 |
| EP | 0 788 149 A1 | 6/1997 |
| JP | 3295043 | 12/1991 |
| JP | 3295044 | 12/1991 |
| JP | 4159636 | 6/1992 |
| JP | 9198726 | 7/1997 |
| WO | WO 96/11472 | 4/1996 |
| WO | WO 97/05610 | 2/1997 |
| WO | WO 02/37488 A1 | 5/2002 |

OTHER PUBLICATIONS

Sumio Hosaka, Hajime Koyanagi and Atsushi Kikukawa, Nanometer Recording on Graphite and Si Substrate Using an Atomic Force Microscope in Air, Japan Journal of Applied Physics, vol. 32 (1993) pp. L464-467, Part 2, No. 3B, Mar. 15, 1993, Central Research Laboratory, Hitachi Limited, Kokubunji, Tokyo 185.

Atsushi Kikukawa, Sumio Hosaka, Yukio Honda[1] and Ryo Imura, Phase-Controlled Scanning Force Microscope, Japanese Journal of Applied Physics, vol. 33 (1994) pp. L1286-L1288, Part 2, No. 9A, Sep. 1, 1994, Advanced Research Laboratory, Hitachi Limited, 1-280 Higashi-koigakubo, Kokubunji-shi, Tokyo 185, 'Central Research Laboratory, Hitachi Limited, 1-280 Higashi-koigakubo, Kokubunji-shi, Tokyo 185.

William P. King, Daniel A. Fletcher and Y. Sungtaek Ju, Nanometer-Scale Thermal Processing for Advanced Manufacturing (YIP '96), Office of Naval Research Annual Grant Report, First Annual Report: May 1, 1996-Apr. 30, 1997, pp. 1-8.

Michael Brooks, Hole in One, New Scientist, Mar. 27, 1999, pp. 46-48.

H. Jonathon Mamin, Robert P. Ried, Bruce D. Terris and Daniel Rugar, High-Density Data Storage Based on the Atomic Force Microscope, Proceedings of the IEEE, vol. 87, No. 6, Jun. 1999, pp. 1014-1027.

Steven W. Schlosser, John Linwood Griffin, David F. Nagle, and Gregory R. Ganer, Filling the Memory Access Gap: A Case for On-Chip Magnetic Storage, School of Computer Science, Carnegie Mellon University, Nov. 1999.

Steven W. Schlosser, John Linwood Griffin, David F. Nagle and Gregory R. Ganger, Carnegie Mellon University, Designing Computer Systems with MEMS-Based Storage, 9th International Conference of Architectural Support for Programming Languages and Operating Systems, 2000.

S. Hosaka, K. Etoh, A. Kikukawa and H. Koyanagi, Megahertz Silicon Atomic Force Microscopy (AFM) Catilever and High-Speed Readout in AFM-Based Recording, Journal of Vacuum Science Technology, vol. 18, No. 1, Jan./Feb. 2000, pp. 94-99.

Robert P. Ried, Air-Bearing Sliders and Plane-Plane-Concave Tips for Atomic Force Microscope Cantilevers, Journal of Microelectromechanical Systems, vol. 9, No. 1, Mar. 2000, pp. 52-57.

L. Richard Carley, Gregory R. Ganger and David F. Nagle, Mems-Based Integrated-Circuit Mass-Storage Systems, Communications of the ACM, vol. 43, No., 11, Nov. 2000, pp. 73-80.

P. Vettiger, M. Despont, U. Drechsler, U. Durig, W. Haberle, M. I. Lutwyche, H.E. Rothuizen, R. Stutz, R. Widmer and G. K. Binning, The "Millepede"—More than one thousand tips for future AFM data storage, I.B.M. J. Res. Develop., vol. 44 , No. 3, May 2000, pp. 323-340.

R. B. Zmood, L. Qin, D. K. Sood, T. Vinay and D. Meyrick, School of Electrical and Computer System Engineering, Royal Melbourne Institute of Technology, Melbourne, Victoria 3000, Australia, Magnetic MEMS Used in Smart Structures Which Exploit Magnetic Materials Properties, Smart Structures and Devices, Proceedings of the SPIE, vol. 4235, 2001, pp. 173-187.

Michael Gross, Small is Great!, New Scientist, Jul. 14, 2001, pp. 1-4.

G. Cherubini, T. Antonakopoulous, P. Bachtold, G. K. Binning, M. Despont, U. Drechsler, A. Dholakia, U. Durig, E. Eleftheriou, B. Gotsmann, W. Haberle, M. A. Lantz, T. Loeliger, H. Pozidis, H. E. Rothuizen, R. Stutz and P. Vettiger, I.B.M. Research, Zurich Research Laboratory, The Millipede, a Very Dense, Highly Parallel Scanning-Probe Data-Storage System, ESSCIRC 2002, pp. 121-125.

E. Eleftheriou, G. Cherubini, H. Pozidis, H. E. Rothuizen and P. Vettiger, Millipede—a MEMS-Based Scanning-Probe Data-Storage System, APMRC 2002, pp. 1-8.

Molecular Chip Patent, Poptronics, vol. 3, No. 5, May 2002, pp. 11-12.

Kenneth J. Korane, A King-Size Future for Nanosize Machines, Machine Design vol. 74, No. 18, Sep. 19, 2002, pp. 88-94.

Peter Vettiger and Gerd Binnig, The Nanodrive Project: Inventing a Nanotechnology Device for Mass Production and Consumer Use is Trickier than it Sounds, Scientific American, vol. 288, No. 1, 2002, pp. 47-53.

Mustafa Uysal, Arif Merchant, Guillermo A. Alvarez, Hewlett Packard Laboratories, Using MEMs-Based Storage in Disk Arrays, Proceedings of Fast '03: 2nd USENIX Conference on File and Storage Technologies, USENIX Association, pp. 89-101, 2003.

Kiyoshi, T., et al., "Switching and memory phenomenon in Langmuir-Blodgett film using a scanning tunneling microscope," Canon, Inc., IEIC Technical Report (1994), vol. 93, No. 524 (OME93 54-59), pp. 7012, Fig. 6, Ref. 15.

Kiyoshi T. et al., Application and Progress in the Scanning Probe Microscopy, High Density Information Storage Using Langmuir-Blodgett Film and Atomic Force Microscopy, Canon, Inc., Journal of the Surface Science Society of Japan (1997), vol. 18, No. 4, pp. 213-218, Fig. 7, Ref. 14.

Kado, H. and Tohda, T., "Nanometer-scale recording on chalcogenide films with an atomic force microscope," Appl. Phys./Lett., vol. 66, No. 22, May 29, 1995, pp. 2961-2962.

Yano, K., et al., "Nanometer scale conductance change in a Langmuir-Blodgett film with the atomic force microscope," Appl. Phys. Lett., vol. 68, vol. 2, Jan. 8, 1996, pp. 188-190.

Yano, K. and Ikeda, T., "Stable bit formation in polyimide Langmuir-Blodgett film using an atomic force microscope," Appl. Phys. Lett., vol. 80, vol. 6, Feb. 11, 2002, pp. 1067-1069.

Barrett, R.C. and Quate, C.F., "Large-scale charge storage by scanning capacitance microscopy," Ultramicroscopy 42-44 (1992) pp. 262-267.

Gardner, E., "AFM Fabricates a Tiny Transistor," Science, vol. 266, Oct. 28, 1994, p. 543.

Hagan, H.P., et al., "Temporal behaviour of nanofeatures on Au," Ultramicroscopy, 42-44 (1992), pp. 587-593.

Majumdar, A., et al., "Nanometer-scale lithography using the atomic force microscope," Appl. Phys. Lett., vol. 61, No. 19, Nov. 9, 1992, pp. 2293-2295.

Mamin, H.J. and Ruger, D., "Thermomechanical writing with an atomic force microscope tip," App. Phys. Lett., vol. 61, No. 8, Aug. 24, 1992, pp. 1003-1005.

Mamin, H.J., et al., "High Density data storage using proximal probe techniques," The IBM Journal of Research and Development, vol. 39, No. 6, Nov. 1995, pp. 681-699.

Manalis, S., et al., "Submicron studies of recording media using thin-film magnetic scanning probes," Applied Physics Letters, vol. 66, No. 19, May 8, 1995, pp. 2585-2587.

Terris, B.D., et al., "Atomic force microscope-based data storage: track servo and wear study," Applied Physics A vol. 66, pp. S809-S813 (1998), (IBM Almaden Research Center, presented STM 97).

Uesugi, K. and Yao, T., "Nanometer-scale fabrication on graphite surfaces by scanning tunneling microscopy," Ultramicroscopy, 42-44 (1992), pp. 1443-1445.

PCT Written Opinion mailed Dec. 18, 2000, International Application No. PCT/US99/30326, filed Dec. 20, 1999.

T.C. Shen et al; Ion irradiation effects on graphite with scanning tunneling microscope; J. Vac.Sci. Technol. B9(2), Mar./Apr. 1991; pp. 1376-1379.

U. Staufer et al; Tailoring nanostructures with a scanning tunneling microscope; J. Vac.Sci. Technol. B9(2), Mar./Apr. 1991; pp. 1389-1393.

H.J. Mamin; Gold deposition from a scanning tunneling microscope tip;, et al.; J.Vac.Sci. Technol B9(2), Mar./Apr. 1991; pp. 1398-1402.

J.A. Dagata, et al. Pattern generation on semiconductor surfaces by a scanning tunneling microscope operating in air;; J. Vac. Sci. Technol. B9(2), Mar./Apr. 1991; pp. 1384-1388.

T.R. Albrecht, et al. Nanometer-scale hole formation of graphite using a scanning tunneling microscope;; Appl.Phys.Lett., vol.55, No. 17, Oct. 23, 1989; pp. 1727-1729.

M.Aono; Has Japan Begun to Move Toward Atomic Level Material Processing?; Science, vol. 258; Oct. 23, 1992.

METHODS FOR WRITING AND READING HIGHLY RESOLVED DOMAINS FOR HIGH DENSITY DATA STORAGE

PRIORITY CLAIM

This application claims priority to the following U.S. Provisional Patent Application:

U.S. Provisional Patent Application No. 60/563,123, entitled "Super Resolution Writing and Reading for High Density Data Storage," filed Apr. 16, 2004.

CROSS-REFERENCE TO RELATED PATENT APPLICATIONS

This application incorporates by reference all of the following applications and the following issued patent:

U.S. patent application Ser. No. 10/684,883, entitled "Molecular Memory Integrated Circuit Utilizing Non-Vibrating Cantilevers," filed Oct. 14, 2003;

U.S. patent application Ser. No. 10/684,661, entitled "Atomic Probes and Media for high Density Data Storage," filed Oct. 14, 2003;

U.S. patent application Ser. No. 10/684,760, entitled "Fault Tolerant Micro-Electro Mechanical Actuators," filed Oct. 14, 2003;

U.S. patent application Ser. No. 10/685,045, entitled "Phase Change Media for High Density Data Storage," filed Oct. 14, 2003;

U.S. patent application Ser. No. 11/003,953, entitled "Systems for Writing and Reading Highly Resolved Domains for High Density Data Storage," filed concurrently;

U.S. patent application Ser. No. 11/004,709, entitled "Methods for Erasing Bit Cells in a High Density Data Storage Device," filed concurrently;

U.S. patent application Ser. No. 11/003,541, entitled "High Density Data Storage Device Having Eraseable Bit Cells," filed concurrently;

U.S. patent application Ser. No. 11/003,955, entitled "Methods for Erasing Bit Cells in a High Density Data Storage Device," filed concurrently;

U.S. patent application Ser. No. 09/465,592, entitled "Molecular Memory Medium and Molecular Memory Integrated Circuit," filed Dec. 17, 1999; and U.S. Pat. No. 5,453,970, entitled "Molecular Memory Medium and Molecular Memory Disk Drive for Storing Information Using a Tunnelling Probe," issued Sep. 26, 1995 to Rust, et al.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

This invention relates to high density data storage using molecular memory integrated circuits.

BACKGROUND

In 1965, Gordon Moore observed an exponential growth in the number of transistors in an integrated circuit and predicted that the trend would continue—and it has. Software developers have pushed each generation of integrated circuit to the limits of its capability, developing steadily more data intensive applications, such as ever-more sophisticated, and graphic intensive applications and operating systems (OS). Each generation of application or OS always seems to earn the derisive label in computing circles of being "a memory hog." Higher capacity data storage, both volatile and non-volatile, has been in persistent demand for storing code for such applications. Add to this need for volume the confluence of personal computing and consumer electronics in the form of personal MP3 players, such as the iPod, personal digital assistants (PDAs), sophisticated mobile phones, and laptop computers, which has placed a premium on compactness and reliability.

Nearly every personal computer and server in use today contains one or more hard disk drives for permanently storing frequently accessed data. Every mainframe and supercomputer is connected to hundreds of hard disk drives. Consumer electronic goods ranging from camcorders to TiVo® use hard disk drives. While hard disk drives store large amounts of data, they consume a great deal of power, require long access times, and require "spin-up" time on power-up. FLASH memory is a more readily accessible form of data storage and a solid-state solution to the lag time and high power consumption problems inherent in hard disk drives. Like hard disk drives, FLASH memory can store data in a non-volatile fashion, but the cost per megabyte is dramatically higher than the cost per megabyte of an equivalent amount of space on a hard disk drive, and is therefore sparingly used.

Phase change media are used in the data storage industry as an alternative to traditional recording devices such as magnetic recorders (tape recorders and hard disk drives) and solid state transistors (EEPROM and FLASH). CD-RW data storage discs and recording drives use phase change technology to enable write-erase capability on a compact disc-style media format. CD-RWs take advantage of changes in optical properties (e.g., reflectivity) when phase change material is heated to induce a phase change from a crystalline state to an amorphous state. A "bit" is read when the phase change material subsequently passes under a laser, the reflection of which is dependent on the optical properties of the material. Unfortunately, current technology is limited by the wavelength of the laser, and does not enable the very high densities required for use in today's high capacity portable electronics and tomorrow's next generation technology such as systems-on-a-chip and micro-electric mechanical systems (MEMs). Consequently, there is a need for solutions which permit higher density data storage, while still providing the flexibility of current phase change media solutions.

BRIEF DESCRIPTION OF THE DRAWINGS

Further details of the present invention are explained with the help of the attached drawings in which.

DETAILED DESCRIPTION

Read/Write Engine for Forming Indicia in a Media

Figure 1A:
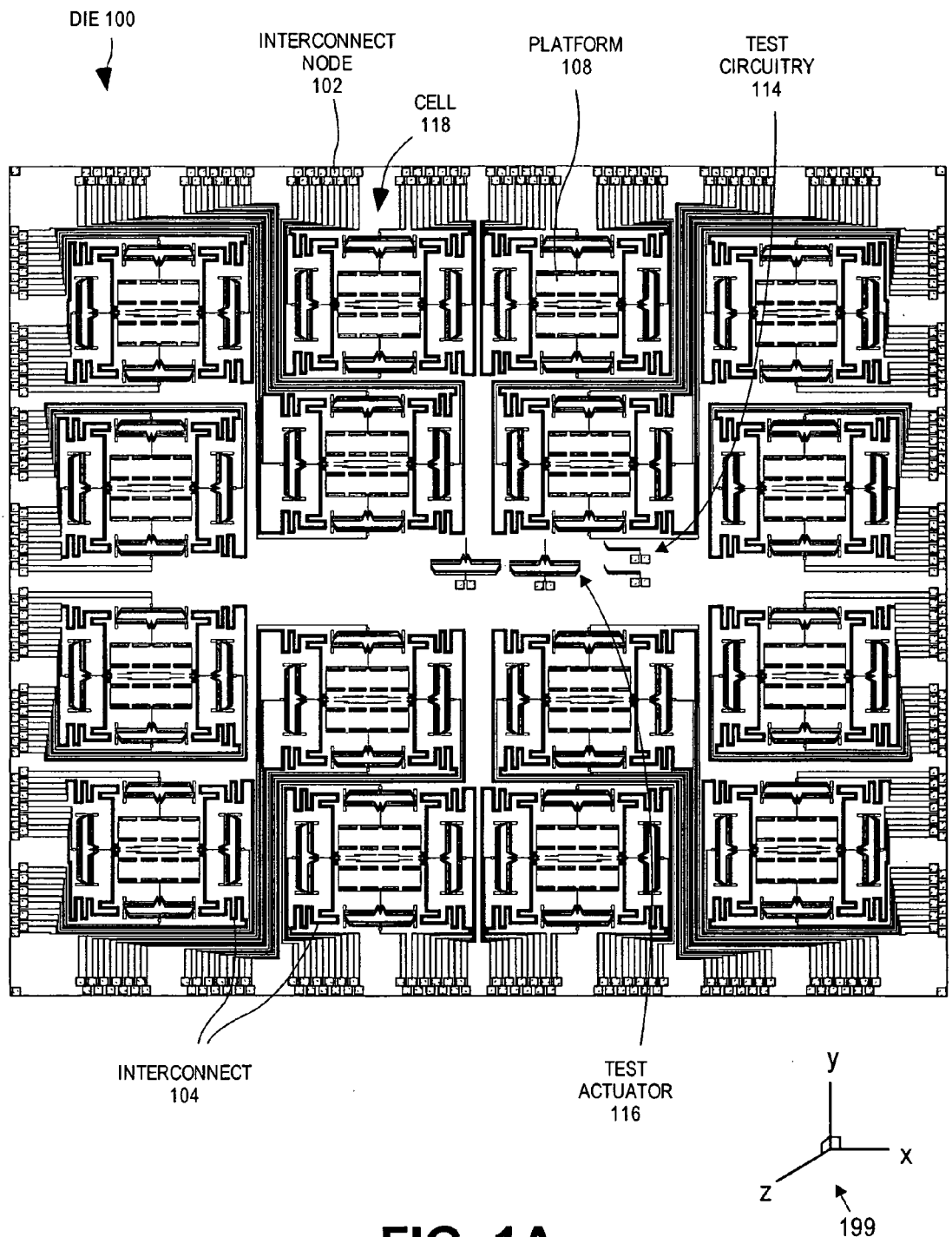
FIG. 1A is an exemplary die for use with an embodiment of the present invention including sixteen cells, each cell having a tip platform comprising sixteen tips.
Figure 1B:
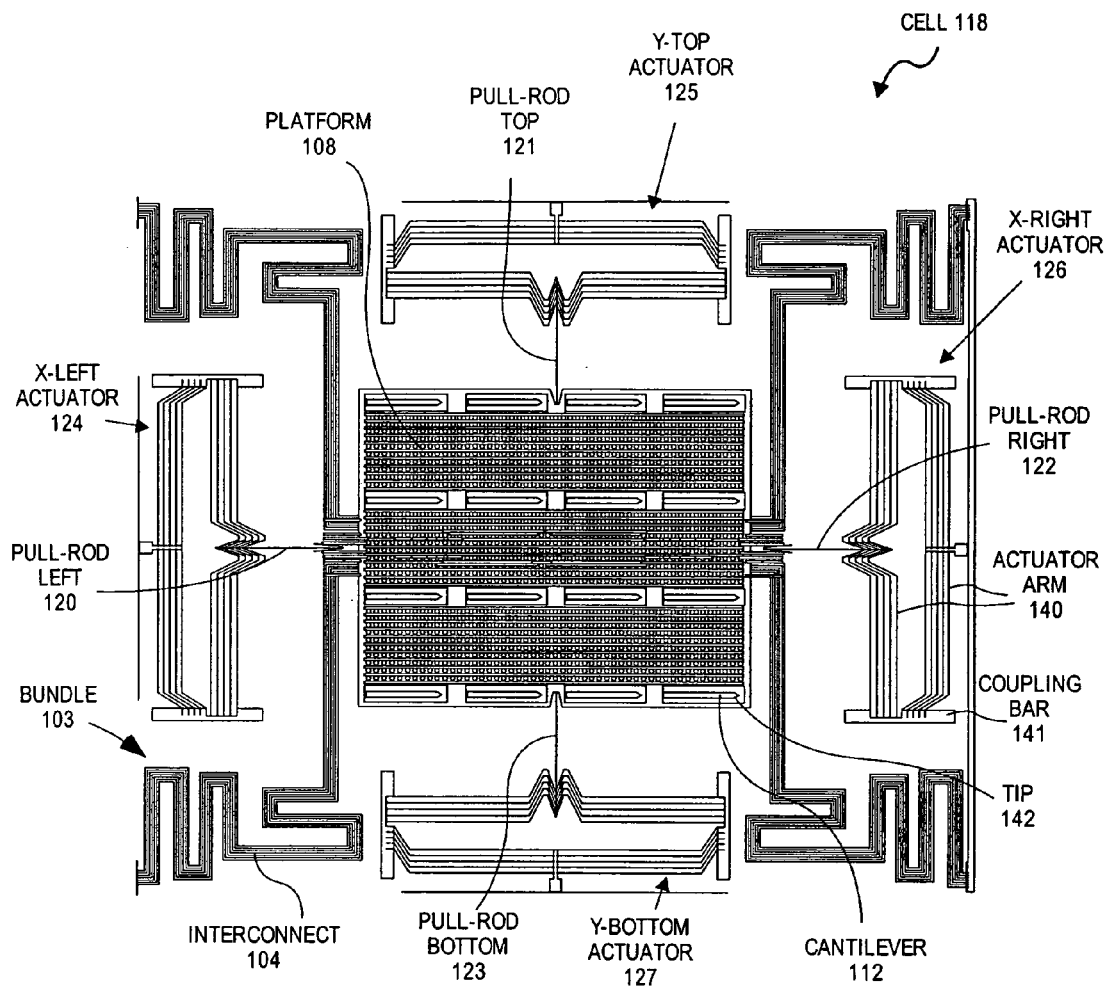
FIG. 1B is a cell of the exemplary die of FIG. 1A.
Figure 1B:
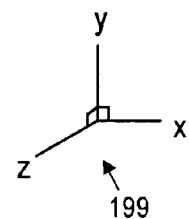

FIGS. 1A and 1B illustrate an exemplary die 100 and an exemplary cell 118 from the exemplary die 100 for use with systems and methods in accordance with the present invention. The die 100 comprises sixteen cells 118, each cell 118 including a tip platform 108 on which sixteen cantilevers 112 are connected. The platform 108 is made positionable by a plurality of actuators 124-127, each actuator being connected with the tip platform 108 by a corresponding pull-rod 120-123. As shown, each tip platform 108 includes four actuators 124-127, an actuator being positioned on each side of the platform 108, allowing the platform 108 to be moved in any direction in a two-dimensional space within the physical limits of the actuators 124-127. The tips 142 extending from the cantilevers 112 and the actuators 124-127 can be electrically coupled to a memory controller, or other outside source by a plurality of interconnects 104, each interconnect 104 electrically connecting a respective cantilever 112 or actuator 124-127 to an interconnect node 102. The interconnect 104 can be made from any number of conductive materials.

Interconnect nodes 102 provide access to the die 100 from sources outside of the die 100. For example, sense and control signals can be sent to, and read from, the actuators 124-127 to determine a position of the actuators 124-127 relative to a neutral state. Different signals can be sent to a tip 142 to read and/or write data to a media positioned in close proximity to the tip 142. Many other signals can be sent through the interconnect node 102 and interconnect 104 as desired in the design of the die 100, the design of the system incorporating the die 100, and/or as desired to meet other design goals. Control signals can be passed through appropriate interconnect nodes 102 and interconnects 104 to direct the actuators 124-127 to perform some action. For instance, a stimulus can be sent to an actuator 124-127 to actuate, causing the pull-rod 120-123 to be drawn toward the outside of the cell 118, thereby moving the platform 108. A control signal can be directed to multiple actuators 124-127 from multiple cells 118 directing multiple platforms 108 to move in the same temporal space. In this way a plurality of cells 118 can be controlled simultaneously, individually, or they can be multiplexed. If cells 118 are multiplexed, then additional multiplexing circuitry is required.

A die 100 can further comprise one or more test structures 114,116 positioned outside of the cells 118. Test structures 114,116 can be measured to ensure proper fabrication of arms of the actuators 124-127 and/or interconnects 104, or other features of the die 100. For example, a test signal can be applied to a test circuit 114 comprising an actuator arm and one or more test nodes, and measurements can be taken of the expansion rates of the arms without potentially damaging any of the interconnect nodes 102. Likewise, a test signal can be applied to a test actuator 116 and a measurement taken to determine the maximum force that the test actuator 116 can apply to a pull-rod 120-123. Other data can be collected as well, such as in situ process testing of the manufacturing process, quality assurance, or reliability testing, (e.g., determining the stress limits of the test actuator 116 or the current requirements for inducing actuator movement). Any number of metrics can be measured using appropriate test structures.

While the exemplary die 100 described above includes an array of four by four (4×4) cells 118, a die 100 for use with systems and methods of the present invention can have any number of different arrangements of cells 118 within the die 100 having the same, fewer, or more cells 118. For example, the die 100 can comprise a single row of sixteen cells 118, or alternatively, an eight by sixteen (8×16) rectangular arrangement of cells 118. A die 100 can include as few as a single cell 118 or as many cells 118 as the manufacturing process permits on a single wafer. As semiconductor manufacturing processes change so that greater die densities and larger wafers can be made, a greater number of cells 118 can be included on a single die 100. The number and arrangement of cells 118 incorporated into a die 100 can be determined based on a target application. For example, where medium storage capacity is required in a very small volume of space, fewer cells 118 can be used. One of ordinary skill in the art can appreciate the myriad different design factors that can be considered in determining a die 100 configuration.

The exemplary die 100 of FIG. 1A can be associated with a media die (shown in FIG. 3A) comprising one or more media cells 318 (shown in FIG. 3B), each media cell 318 corresponding to one or more tips 142. The exemplary die 100 and media die can be positioned in operative association to one another such that the tips 112 can be electrically connected with the media surface.

FIG. 1B is an illustration of a cell 118 from the exemplary die 100 of FIG. 1A. The cell 118 includes sixteen tips 142 associated with a platform 108 for writing and reading to a media. Each tip 142 extends, or is otherwise connected with a distal end of a cantilever 112. The cantilever 112 can be connected with the platform 108. In other embodiments, the platform 108 can be associated with fewer, or more tips 142. The platform 108 can comprise a frame or lattice structure for supporting the cantilevers 112, and can comprise some material or combination of materials having a thermal coefficient across a prescribed operating range substantially similar to a thermal coefficient of a corresponding media platform 308 (shown in FIG. 3B) across the same operating range. It can be important for reading and writing that the thermal expansion of the platform 108 substantially match a thermal expansion of the media platform 308 so that individual tips 142 arranged across the platform 108 can be properly positioned over a desired indicia or target location of a respective media device 350 (also referred to herein as a media region). A disparity in a thermal expansion coefficient between the media platform 308 and the platform 108 that exceeds, for example, the platform's ability to compensate for slight drift over an operating range, can result in a tip 142 being improperly positioned over the media device 350, leading to read and/or write errors. For example, an indicia written to a media device 350 can be improperly indexed by a servo system of the die 100, or the wrong indicia can be erroneously read, corrupting a result. The tip 142 should be capable of reading an indicia that the tip 142 intends to read, and write to a position to which the tip 142 intends to write (and to which the die 100 is capable of correctly indexing). The ability of the platform 308 to compensate for slight drift over an operating range can determine how closely matched should be the coefficient of thermal expansion of a platform 108 and the coefficient of thermal expansion of a media platform 308, and can be dependent on the density of information storage, a size of a written indicia, a size and/or geometry of the platform 108, a size of the tip 142, and other factors.

Figure 1C:
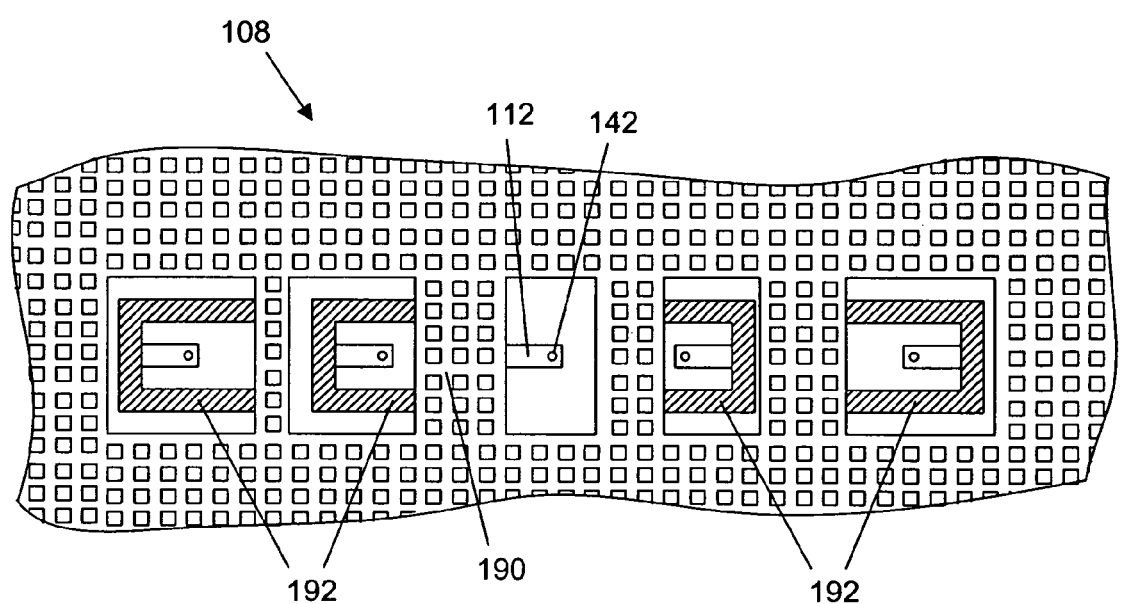
FIG. 1C is an embodiment of a platform in accordance with the present invention including a sub-platform associated with a main platform, wherein a cantilever is connected with the sub-platform.

The media platform 308 and tip platform 108 need not be made of the same material to achieve the desired thermal expansion rates, or desired matching of thermal expansion rates. It is known that materials can be carefully doped so that such materials are tailored to thermally expand at a desired rate over a desired temperature range. For example, in one embodiment, a platform 108 for supporting a plurality of tips 142 can comprise silicon, while a corresponding media platform 308 can comprise an alloyed metal having an equivalent coefficient of thermal expansion as silicon over the desired operating range (e.g., 0-70° C.). Further, in some embodiments, the platform 108 can comprise a plurality of materials associated with one another so that a desired thermal drift is achieved as a result of the association of the plurality of materials. For example, referring to FIG. 1C, in an embodiment, one or more of cantilevers 112 associated with a platform 108 can be mounted on a sub-platform 192 (in this case a "C"-shaped sub-platform) connected with a main platform 190 the sub-platform comprising a material having a high thermal expansion coefficient (e.g., nickel or aluminum). The main platform 190 in this example comprises an oxide material. Each sub-platform 192 is sized so that the sub-platform 192 expands at a desired rate, causing the cantilever 112 mounted on the sub-platform 192 to drift with the thermal expansion of the sub-platform 192, thereby tracking the thermal expansion of a corresponding media platform 308, despite the low expansion of the main platform 190. In such an embodiment, the main platform 190 can comprise a material having a coefficient of thermal expansion substantially lower than that of a material of the media platform 308, and the sub-platform 192 can comprise a material having a coefficient of thermal expansion higher than that of the material of the media platform 308, so that the drift of the cantilever 112, and by extension the tip 142, expands as desired over the operating temperature of the die 100. The sub-plafforms 192 compensate for the difference in thermal expansion of the main platform 190 and the media platform 308, and the geometry as well as the material of the sub-platform 192 can be chosen to achieve the desired result. The sub-platform 192 need not be "C"-shaped as shown. In still other embodiments, a platform 108 in accordance with the present invention can be arrayed with a composite of metal and oxide structures in a grid, the geometries of the metal and oxide structures defining a net coefficient of thermal expansion of the composite platform 108 that is substantially similar to a coefficient of thermal expansion of the media platform 308. One of ordinary skill in the art will appreciate the myriad different combinations of materials and geometries that can be employed to achieve a platform 108 wherein the tips 142 drift with a change in temperature at substantially the same rate as the expansion of the media platform 308.

In an embodiment as shown in FIG. 1B, the platform 108 can comprise a material having a low coefficient of thermal expansion, for example silicon dioxide. Having a platform 108 with a frame structure of a material having a low coefficient of expansion can limit the amount of drift of a tip 142 within a corresponding media, and the amount of drift of the tip 142 relative to every other tip 142. The tips 142 can comprise silicon, or some other conductive material, or alternatively an insulator having a conductive coating. The tips 142 can be integrally formed with the platform 108 using a combination of well known semiconductor manufacturing processes. One of ordinary skill in the art can appreciate the means for forming cantilevers having conductive tips 112 on an insulated frame.

Figure 1D:
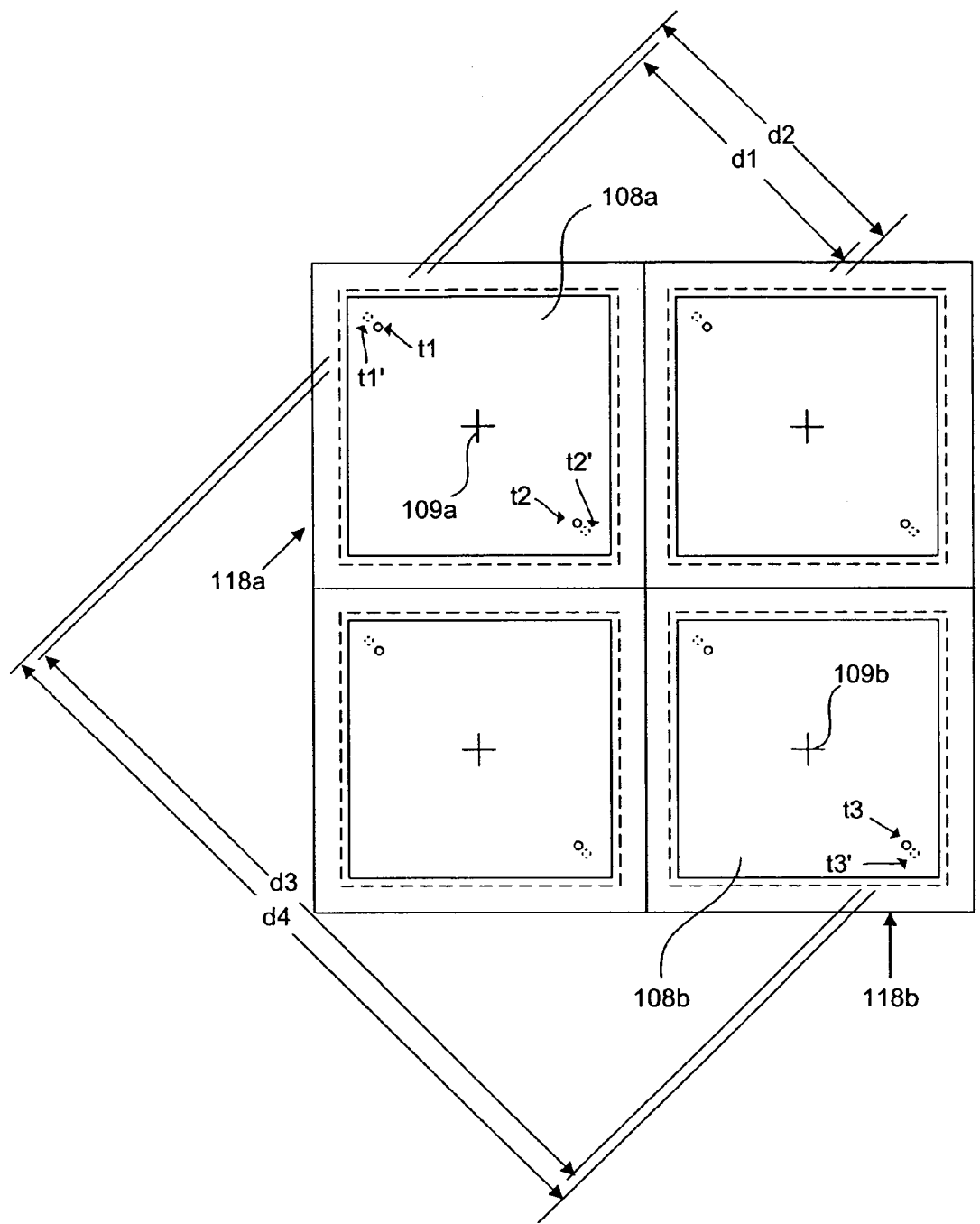
FIG. 1D is a schematic showing hypothetical thermal expansion of four platforms within four cells.
Figure 1E:
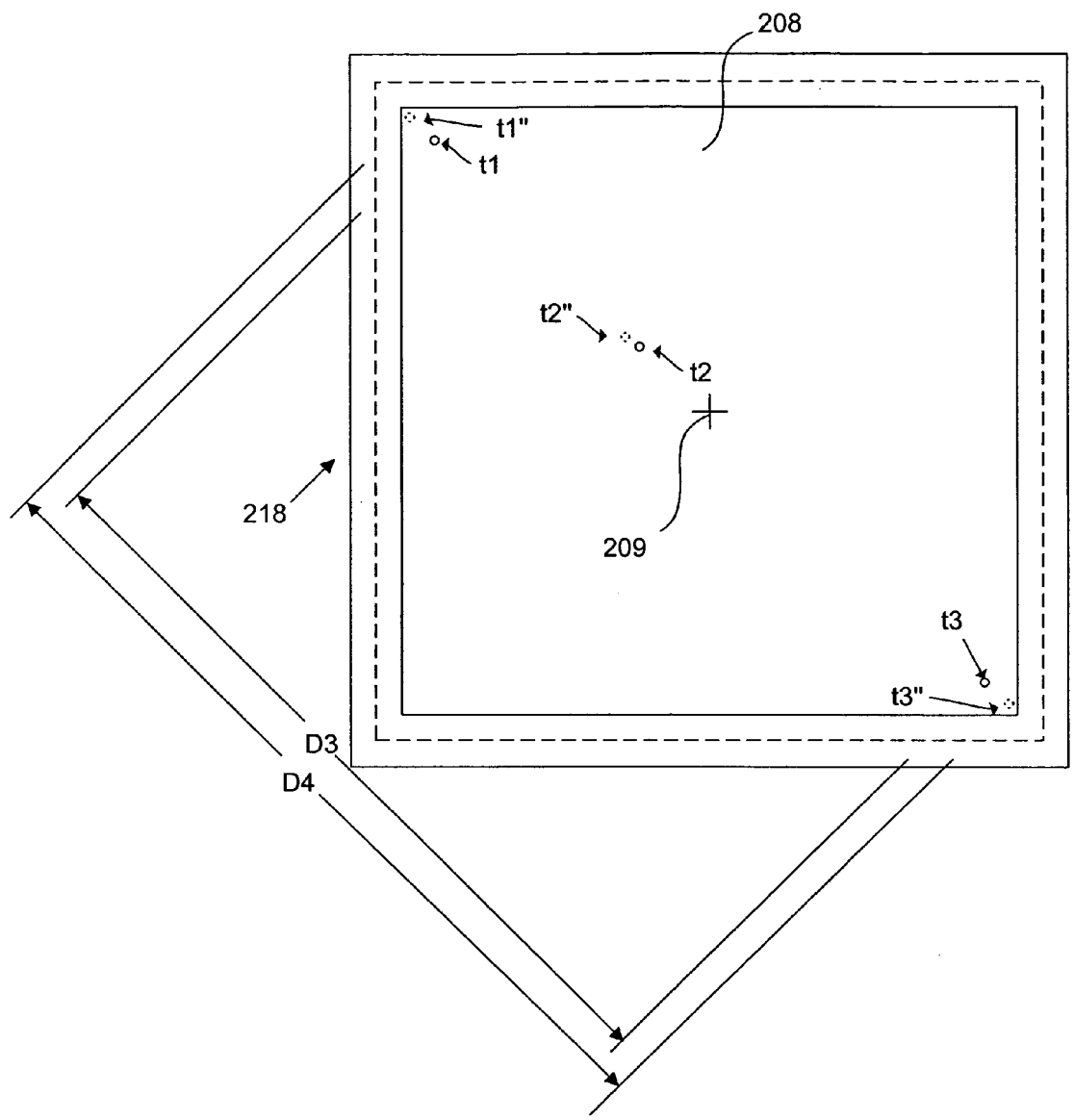
FIG. 1E is a schematic showing hypothetical thermal expansion of a single platform having a size similar to that of the four cells.

Referring to FIGS. 1D and 1E, thermal drift between tips 142 can further be limited by separating the die 100 into multiple cells 118. A cell 118 can include a platform 108 of a limited size (i.e., a platform having a small form factor). As shown in FIGS. 1A and 1B, each platform 108 supports sixteen cantilevers 112, although in other embodiments fewer or more cantilevers 112 can be supported, depending on a size of a platform 108. The size of the platform 108 can be limited to a size that results in an acceptable level of drift during operation between tips 142 positioned at a maximum distance from one another on the platform 108. For example, as shown schematically in FIG. 1D four cells 118 are arranged in a 2×2 square, each cell 118 having a platform 108 with a platform center 109. The die 100 can heat because of a flow of current through the die 100, movement of the platforms 108 within the cells 118, and environmental effects. As the die 100 heats, the platforms 108 can expand.

As can be seen in FIG. 1D, a first tip t1 and a second tip t2 are associated with a first platform 108a, and a third tip t3 is associated with a second platform 108b. The first tip at an initial position t1 can shift to a final position t1' due to thermal expansion of the first platform 108a. A second tip at an initial position t2 (a distance x from the center 109a of the first platform 108a) can shift to a final position t2' due to thermal expansion. An initial distance d1 between the first tip and the second tip thus expands to a final distance d2 between the first tip and the second tip. Thermal drift can result in possible servo errors and misreading of data. The thermal expansion of a platform 108 is isolated relative to every other platform 108 and the platform 108 expands into empty space within the cell 118. Such expansion can possibly cause slight displacement of the actuators 124-127 and interconnects 104, but does not cause the overall cell 118 size to increase, limiting the effects of thermal expansion on tip drift. While the platform 108 expands, the center 109 of the platform 108 can remain in the same position, roughly. Thus for example, the third tip, also a distance x from the center 109b of the second platform 108b, shifts to a final position t3' due to thermal expansion. An initial distance d3 between the first tip and the third tip expands to a final distance d4 between the first tip and the third tip. The increase in absolute distance between the first tip and the third tip (d4-d3) is roughly the same as the increase in absolute distance between the first tip and the second tip (d2-d1). Thus, d4-d3=d2-d1.

As shown in the schematic of FIG. 1E, a single cell 218 having a size similar to the space occupied by the four cells 118 of FIG. 1D includes a platform 208 that expands at a compounded rate relative to the expansion of each of the platforms 108 of FIG. 1D. As can be seen, a first tip at an initial position t1 can shift to a final position t1" due to thermal expansion of the platform 208. The first tip, though located in the same initial position as the first tip of FIG. 1D, is a further distance from the center 209 of the corresponding platform 208 than the first tip of FIG. 1D. As a result, the distance between the final position t1" and the initial position t1 of the first tip of the single platform 208 is greater than the distance between the final position t1' and the initial position t1 of the first tip for each of the smaller platforms 108. A third tip at an initial position t3 can shift to a final position t3" due to thermal expansion, again with the distance between the final position t3" and the initial position t3 of the third tip of the single platform 208 being greater than the distance between the final position t3' and the initial position t3 of the third tip for each of the smaller platforms 108. As a result, a distance D3 between the first tip and the third tip of the single platform 208 expands to a distance D4 between the first tip and the third tip of the single platform 208. The expansion in distance (D4-D3) across a single large platform 208 is greater than the expansion in distance (d4-d3) across two smaller platforms 108 (D4-D3>d4-d3). The expansion of the platform 208 is compounded because the platform 208 must expand outward into the single cell 218. Of course, the platform 208 of FIG. 1E will have relatively smaller expansion across platforms 208 arranged in a 2×2 square (as the smaller platforms 108 of FIG. 1D are arranged), when compared with a platform (not shown) yet four times the size of the platform 208 of FIG. 1E. Systems and methods in accordance with the present invention can scale the size of a tip platform 108 so that the tip platform 108 has appropriate expansion characteristics that are within the general error tolerance of the circuitry (e.g., positioning circuitry, servo circuitry, etc.) of the die 100. It has been demonstrated that a die 100 as described above with reference to FIG. 1A includes such a tip platform 108.

Use of small form factor platforms 108 as described above can provide a memory device and system with thermal stability. Further, generally platforms having a relatively small number of cantilevers, wherein a small number of cantilevers is roughly defined as approximately one hundred cantilevers or less (i.e., an order of magnitude smaller than a platform supporting one thousand tips), can provide a memory device and system with thermal stability. Thermal stability can be defined as having thermal drift characteristics over a desired operating range that are within a tolerance of the system circuitry. One of ordinary skill in the art will note from the descriptions and benefits described herein that platforms sized to support fewer cantilevers can potentially enjoy such benefits to an increasing degree. In additional to thermal stability a small form factor platform 108 has a lower mass when compared with a larger form factor platform 108. In general, a platform 108 having lower mass can be actuated at a higher speed when compared with a platform 108 comprising a similar material having a higher mass. Small form factor platforms 108, therefore, can provide a capability of faster access speed, improving overall performance of a memory device. Further, small form factor platforms 108 provide inherent fault tolerance. In the event that a fault tolerance scheme for a set of actuator arms (as described below) fails for a single platform 108, a loss of capacity of a memory device is limited to the portion of a media device accessed by the single platform 108. A tip platform 108 that supports a relatively small number of cantilevers 112 (e.g., sixteen cantilevers) can have advantages over a tip platform that supports hundreds or thousands of cantilevers, for example. However, systems and methods in accordance with the present invention can include one or more platforms supporting hundreds or thousands of cantilevers, where desired.

Referring again to FIG. 1B, a platform 108 is positionable using four bi-morph actuators: an X-left actuator 124 coupled by a left pull-rod 120 with the tip platform 108, a Y-top actuator 125 coupled by a top pull-rod 121 with the tip platform 108, an X-right actuator 126 coupled by a right pull-rod 122 with the tip platform 108, and a Y-bottom actuator 127 coupled by a bottom pull-rod 123 with the tip platform 108. Each actuator 124-127 includes two sets of arms connected by a coupling bar 141, with each set of arms including a plurality of bi-morph arms 140. When a voltage is applied via an interconnect 104 to a bi-morph arm 140, the bi-morph arm 140 bends toward the outer edge of the cell 118. Collectively, the two sets of arms draw the pull-rod 120-123, which in turn pulls the platform 108, causing the platform 108 to shift in position toward the energized actuator. The platform 108 can have relative movement typically in the range of plus or minus fifty microns, but this range can be extended or reduced as required by various design goals. Also, the actuators 124-127 are not required to have an identical movement range in order to permit the cell 118 to function. For example, the X-axis actuators 124,126 could have a range of plus to minus fifty microns while the Y-axis actuators 125,127 could have a range of plus to minus sixty-five microns, or vice versa. In other embodiments, the actuators 124-127 can comprise structures other than bi-morph structures, for example, the actuators 124-127 can comprise comb-electrode structures (for example as described in U.S. patent application Ser. No. 09/465,592, entitled "Molecular Memory Medium and Molecular Memory Integrated Circuit," Attorney Docket No. LAZE-01000US0, filed Dec. 17, 1999). In still other embodiments, the tip platform 108 need not include actuators, for example where a corresponding media platform 308 is employed having sufficient range of movement.

A plurality of interconnects 104 are electrically coupled with the platform 108, for example in bundles 103, with each bundle 103 including interconnects 104 associated with a plurality of tips 142. As shown, the cell 118 includes four bundles 103, with each bundle 103 including four interconnects 104 corresponding to four tips 142. In other embodiments, the cell 118 can include one or more bundles 103, and each bundle 103 can comprise one or more interconnects 104. Each bundle 103 can be coiled or routed in an accordion-like fashion so that the interconnect 104 can expand— for example by partially unfolding, thereby preventing the interconnect 104 from restricting movement of the tip platform 108 away from the interconnect 104—or collapse, for example by bending to accommodate a shorter distance where the tip platform 108 is drawn toward the interconnect 104. A separate set of interconnects (not shown) is connected with each actuator 124-127 to energize the actuator 124-127. In some embodiments, the interconnect 104 can restrict undesired movement of the tip platform 108. For example, in an embodiment an interconnect 104 can include a cross-section having a deep z dimension, i.e. having a dimension along a plane perpendicular to the plane of the die 100 (also referred to herein as a z dimension). Such geometry can restrict movement of the platform 108 in the z dimension, thereby helping to ensure a desired z positioning of the platform 108 relative to the media platform 308. Where the interconnect 104 is configured, as described, to restrict z movement of the platform 108, it can be said that the interconnect 104 acts as a "suspension." Such an arrangement can have an advantage that actuators 124-127 need not hold the platform 108 as rigid in the z dimension.

The actuators 124-127 can further include a fault tolerant design so that the actuators 124-127 will function so long as they are not completely destroyed, thereby increasing reliability and lifetime of a die. The fault tolerant design is described in more detail in U.S. patent application Ser. No. 10/684,760, entitled "Fault Tolerant Micro-Electro Mechanical Actuators," filed Oct. 14, 2003. As can be seen in FIG. 1B, each actuator 124-127 includes two sets of arms, each set having multiple bi-morph arms 140. If one of the arms on an actuator 124-127 breaks, that arm 140 will form an open circuit. A broken arm 140 will reduce the potential force that an actuator 124-127 can exert upon the platform 108, thereby reducing the maximum range with which the actuator 124-127 can move the platform 108. The actuator 124-127 can be built so that the maximum range of movement of the actuator 124-127 exceeds the usable range of movement of the tip 142 so that where actuator 124-127 performance degrades, no degradation in cell 118 performance results. FIG. 1B shows each actuator 124-127 with a total of twenty arms 140. Increasing the number of arms 140 can increase the fault tolerance of the actuator 124-127, but it will also increase the amount of physical space required for the actuator 124-127. Likewise, fewer arms 140, such as six arms 140, can reduce the amount of physical space required for the actuator 124-1276, but it will in turn increase the sensitivity that an actuator 124-127 has to damage, thus reducing its efficiency for being fault tolerant.

A tip 142 and a corresponding cantilever 112 can be formed so that the tip is in constant contact or near contact as the tip platform 108 moves along the media surface. In one embodiment in accordance with the present invention, the cantilever 112 can have curvature such that the cantilever 112 curves away from a plane defined by the platform 108, and toward the media surface. Consequently, as a media platform 308 (shown in FIG. 3A) is positioned in close proximity to the tip platform 108, the tip 142 will make first contact with the media platform 308. The cantilever 112 can be designed such that it has a spring-like response when pressure is applied to the cantilever 112 from either the tip platform 108 or media platform 308. Hence, small changes in the distance between the tip platform 108 and the media platform 308 will not necessarily cause the cantilever 112 to break electrical contact with the media surface. The tip 142 of the cantilever 112 can be positioned within the media through movement of the tip platform 108 and/or the media platform 308 by the respective actuators 124-127.

In other embodiments, the tips 142 can have independent directional control. Thus, cantilevers 112 could be designed to be capable of moving along all three axes as defined by reference 199 (x-axis, y-axis, and z-axis). Such a design would require additional interconnections 104 in order to allow control signals to direct cantilevers 112.

Forming Ultra-Shape Tips

To form fine domains in a media surface, a tip having an extremely fine tip width can be formed. One method of forming a tip in accordance with the present invention can include forming a silicon nitride (SiN) hard mask on a silicon substrate and applying an isotropic etch to form a sharp tip. The method can include depositing SiN on a silicon wafer, for example using plasma enhanced chemical vapor deposition (PECVD) processing techniques or low pressure chemical vapor deposition (LPCVD) processing techniques. The wafer is then coated with photoresist, and exposed using standard lithography techniques to form a tip pattern comprising one or more small squares (also referred to herein as pads) sized according to a desired tip height. For example, where an approximately 2 µm tall tip is desired, a 3 µm×3 µm square can be formed. The SiN not protected by the photoresist mask can be removed from the surface using an anisotropic etch, for example in a plasma etcher. The photoresist can optionally be removed, leaving one or more SiN hard masks.

Figure 2:
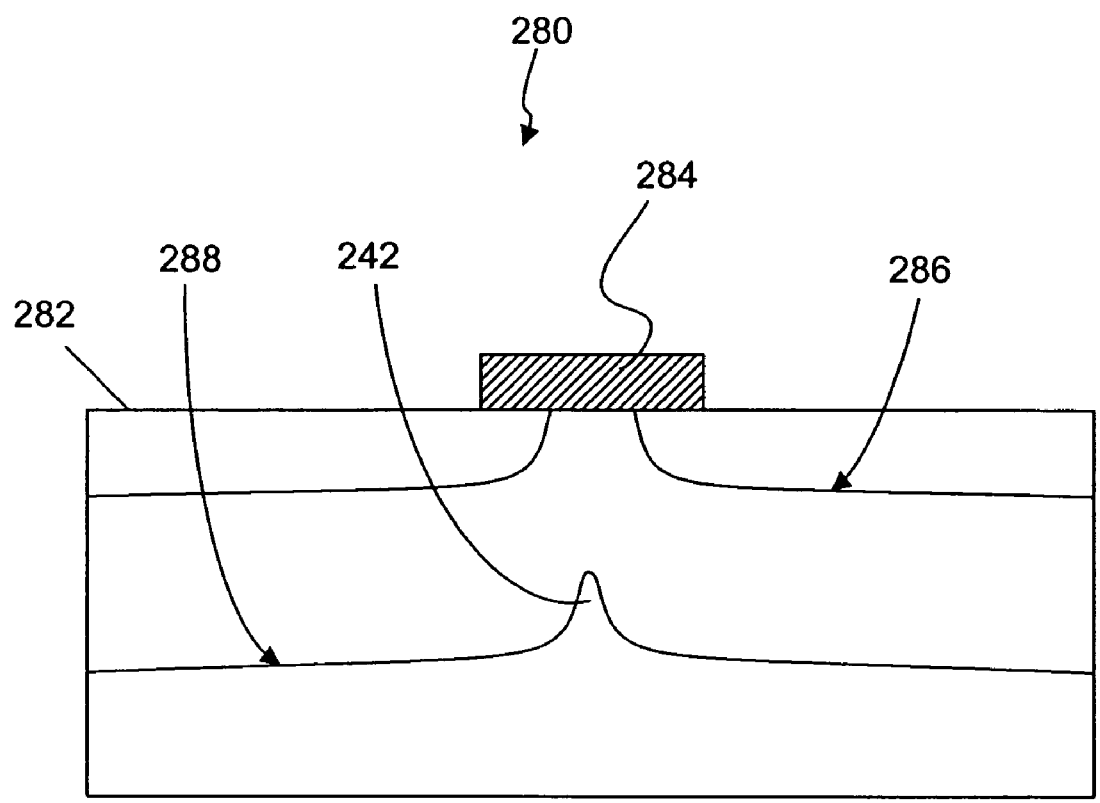
FIG. 2 is a cross-section of a film stack for use in forming ultra-sharp tips for use in the exemplary die of FIG. 1B.

FIG. 2 illustrates processing of a portion of a wafer 280 over a series of recipe steps. A hard mask 284 is formed over a silicon surface 282 as described above. The wafer can then be isotropically etched, for example in a liquid chemical bath (i.e., wet etched) or in a plasma etcher using a sulfur hexaflouride ($SF_6$) chemistry. The isotropic etch can be applied such that the hard mask is undercut by about 1 µm, as shown by the second line 286 in FIG. 2. The etch can be endpointed visually, for example by observing the structures under an optical microscope. If the photoresist has not been removed prior to performing the isotropic etch, the photoresist must then be removed. The wafers are cleaned to remove residual photoresist and other contamination prior to subsequent processing, for example in a wet chemical bath such as a piranha. Following these steps, the wafer is placed in an oxide growth furnace and oxidized so that a portion of the silicon is consumed during the oxide growth process, the portion corresponding to the third line 288. Approximately 1 µm of oxide can be grown to form a satisfactory tip. The nitride hard mask impedes oxide growth at the top of the tip, and the oxide grows steadily inward from the sides at least until the oxide completely undercuts the nitride pad. Once the wafer is removed from the furnace, the oxide can be stripped, for example in a chemical bath by hydrofluoric (HF) acid. The nitride pads fall off as the oxide is undercut by the etchant. The high etch selectivity between the oxide and the silicon will result in removal of the oxide with approximately no removal of silicon. The result of this step is the formation of ultra sharp silicon tips 242. The wafers can further be reoxidized, if desired, to form oxide tips. Further, the tip height can be increased by performing an anisotropic silicon etch either before the isotropic etch or after.

Storage Media for Use with the Read/White Engine

Figure 3A:
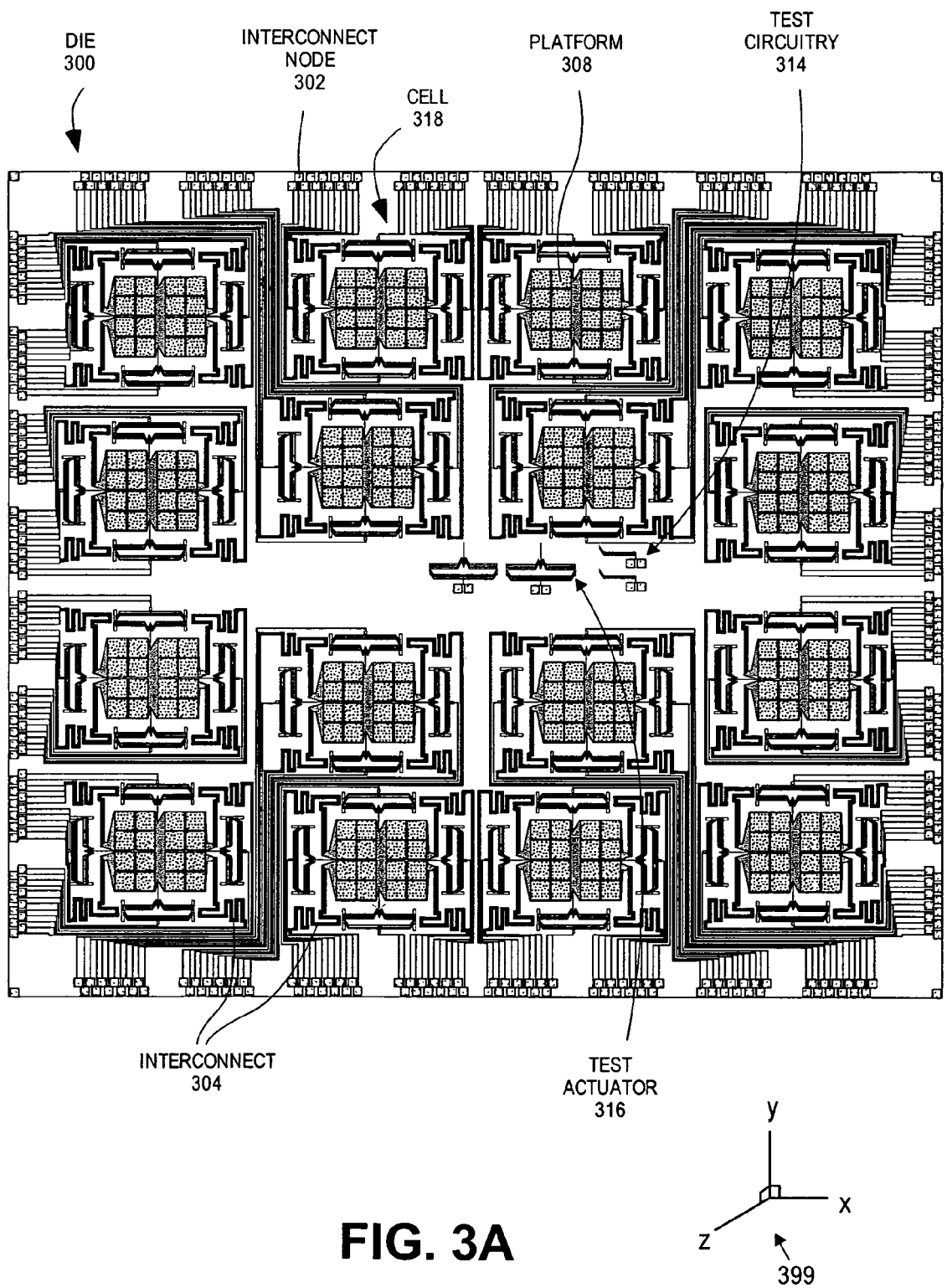
FIG. 3A is an exemplary media die corresponding to the exemplary die of FIG. 1A for use with an embodiment of the present invention, the media die including sixteen cells, each cell having a media platform comprising sixteen media devices.
Figure 3B:
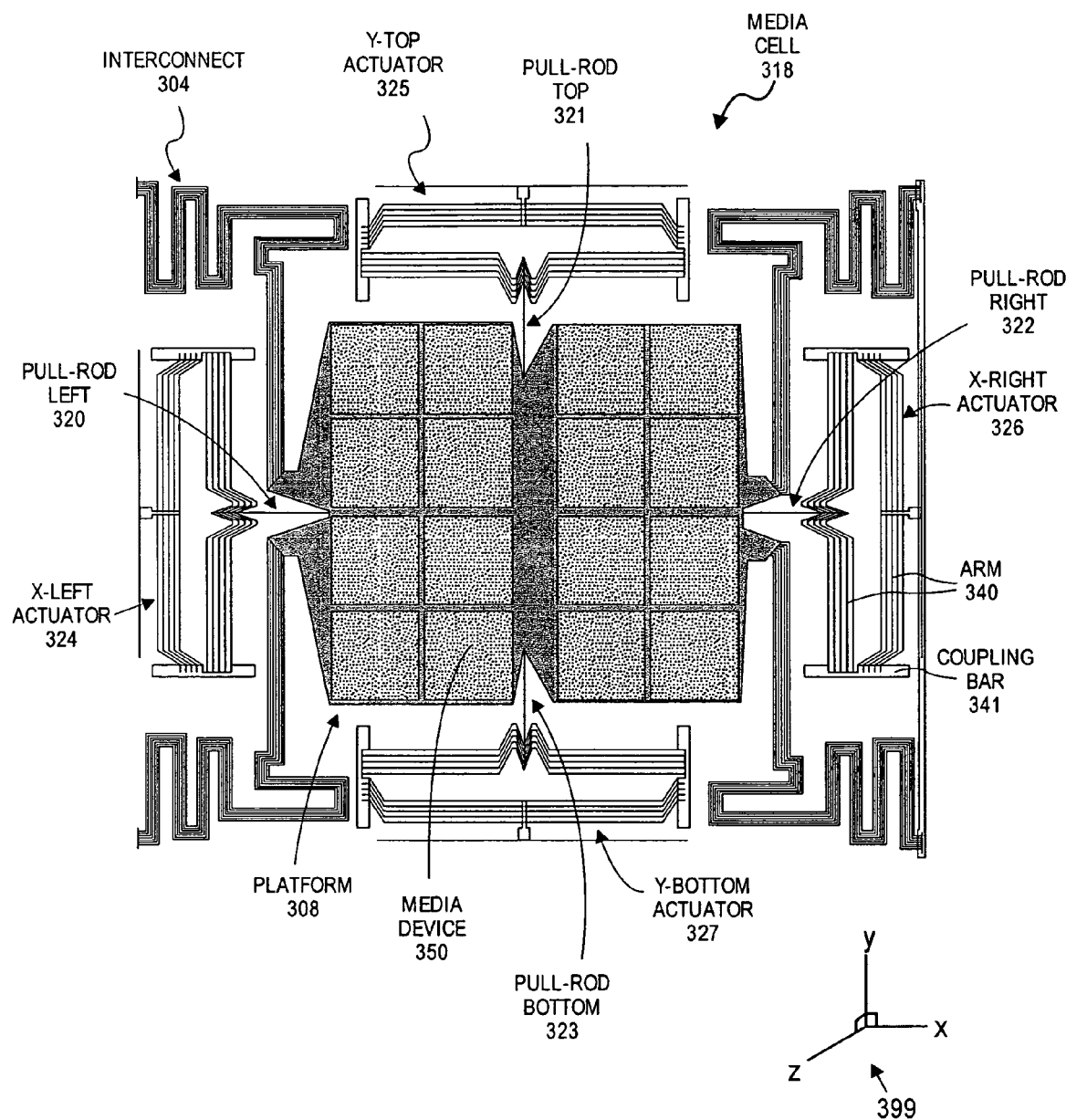
FIG. 3B is a cell of the exemplary media die of FIG. 3A.

FIGS. 3A and 3B illustrate an exemplary media die 300 and an exemplary media cell 318 from the exemplary media die 300 for use with systems and methods in accordance with the present invention. The media die 300 comprises sixteen cells 318, each cell 318 including a media platform 308 on which sixteen media devices 350 are connected. The platform 308 is made positionable by a plurality of actuators 324-327, each actuator being connected with the media platform 308 by a corresponding pull-rod 320-323. As shown, each media platform 308 includes four actuators 324-327, an actuator being positioned on each side of the media platform 308, allowing the platform 308 to be moved in any direction in a two-dimensional space within the physical limits of the actuators 324-327. The media device 350 and the actuators 324-327 can be electrically coupled to a memory controller, or other outside source by a plurality of interconnects 304, each interconnect 304 electrically connecting a respective memory device 350 or actuator 324-327 to an interconnect node 302. The interconnect 304 can be made from any number of conductive materials.

As with the die 100, the media die 300 includes interconnect nodes 302 that provide access to the media die 300 from sources outside of the media die 300. Further, the media die 300 can likewise further comprise one or more test structures 314,316 positioned outside of the cells 318. While the media die 100 shown in FIG. 3A includes an array of four by four (4×4) cells 318, a media die 100 for use with systems and methods of the present invention can have any number of different arrangements of media cells 318 within the media die 300 configured and arranged to correspond to a configuration of a corresponding die 100. As described above, the exemplary die 100 and media die 300 can be positioned in operative association relation to one another such that the tips 142 can be electrically connected with corresponding media devices 350, FIG. 3B is an illustration of a memory cell 318 for use with embodiments of the present invention. The memory cell 318 includes a platform 308 connected with sixteen media device 350 which can be active or passive (as described in detail below). As with the tip platform 208, the media platform 308 can comprise a frame or lattice structure for supporting the media devices 350, and comprise a material having a coefficient of thermal expansion substantial similar to the material comprising the platform 108. As above, in some embodiment the media platform 308 can comprise a composite structure. In one embodiment, the media platform 308 can comprise some material having a low coefficient of expansion, for example a silicon dioxide. Having a platform 308 with a frame structure of a material having a low coefficient of expansion can minify the amount of drift of each media device 350 relative to a corresponding tip 142. Each media device 350 can be isolated from every other media device 350, or the media cell 318 can be a continuous surface. In other embodiments, the platform 308 can be connected with fewer or more media devices 350. A media die 300 can include one or more memory cells 318, for example corresponding to a number of tip platforms 108 on a die 100.

As with the tip platform 208, the media platform 308 is positionable using four bi-morph actuators: an X-left actuator 322 coupled by a left pull-rod 320 with a media platform 308, a Y-top actuator 326 coupled by a top pull-rod 324 with the media platform 308, an X-right actuator 328 coupled by a right pull-rod 330 with the media platform 308, and a Y-bottom actuator 332 coupled by a bottom pull-rod 334 with the media platform 308. Each actuator 324-327 includes two sets of arms connected by a coupling bar 341, each set including a plurality of bi-morph arms 340. When a voltage is applied via an interconnect (not shown) to the bi-morph arms 340, the bi-morph arms 340 bends such that the attached pull-rod is pulled into the actuator. Collectively, the two sets of arms can draw the pull-rod 320-323, which in turn pulls the media platform 308, causing the media platform 308 to shift in position toward the energized actuator. As with the tip platform 208, the media platform 308 can have relative movement typically in the range of plus or minus fifty microns, but this range can be extended or reduced as required by various design goals. Also, the actuators 324-327 are not required to have an identical movement range in order to permit the cell 318 to function. In other embodiments, the actuators 324-327 can comprise structures other than bi-morph structures, for example, the actuators 324-327 can comprise comb-electrode structures. In still other embodiments, the media platform 308 need not include actuators, for example where a corresponding tip platform 208 is employed having sufficient range of movement. As described above, the actuators 324-327 can further include a fault tolerant design so that the actuators 324-327 will function so long as they are not completely destroyed, thereby increasing reliability and lifetime of a die.

A plurality of interconnects 304 are electrically coupled with the media platform 308, for example in bundles with each bundle including interconnects 304 corresponding to a plurality of media devices 350. As shown, the cell 318 includes four bundles, with each bundle including four interconnects 304 corresponding to four media devices 350. In other embodiments, the cell 318 can include one or more bundles 303, and each bundle 303 can comprise one or more interconnects 304. Each bundle 303 can be coiled or routed in an accordion-like fashion so that the interconnect 304 can expand—for example by partially unfolding, thereby preventing the interconnect 304 from restricting movement of the media platform 308 away from the interconnect 304—or collapse, for example by bending to accommodate a shorter distance where the media platform 308 is drawn toward the interconnect 304. Additionally, a pair of interconnects 304 are connected with each actuator to energize the actuator 304, as described above. In some embodiments, the interconnect 304 can restrict undesired movement of the media platform 308. For example, as above, in an embodiment an interconnect 304 can include a cross-section having a deep z dimension, i.e. having a dimension along a plane perpendicular to the plane of the die 300 (also referred to herein as a z dimension). Such geometry can restrict movement of the media platform 308 in the z dimension, thereby helping to ensure a desired z positioning of the media platform 308 relative to the platform 308. Where the interconnect 304 is configured, as described, to restrict z movement of the tip platform 108, it can be said that the interconnect 304 acts as a "suspension." Such an arrangement can have an advantage that actuators 324-327 need not hold the media platform 308 as rigid in the z dimension.

The actuators 324-327 can further include a fault tolerant design so that the actuators 324-327 will function as long as they are not completely destroyed, thereby increasing reliability and lifetime of a die. As can be seen in FIG. 3, each actuator 324-327 includes two sets of arms, each set having multiple arms 340. If one of the arms 340 breaks, that arm 340 will form an open circuit. A broken arm 340 will reduce the potential force that an actuator 324-327 can exert upon the media platform 308, thereby reducing the maximum range with which the actuator 324-327 can move the media platform 308. The actuator 324-327 can be built so that the maximum range of movement of the actuator 324-327 exceeds the usable range of movement of the corresponding tips 242 so that where actuator 324-327 performance degrades, no degradation in media cell 318 performance results. FIG. 3 shows each actuator 324-327 with a total of twenty arms 340. Increasing the number of arms 340 can increase the fault tolerance of the actuator 324-327, but it will also increase the amount of physical space required for the actuator 324-327. Likewise, fewer arms 340, such as six arms 340, can reduce the amount of physical space required for the actuator 324-327, but it will in turn increase the sensitivity that an actuator 324-327 has to damage, thus reducing its efficiency for being fault tolerant.

Figure 4A:
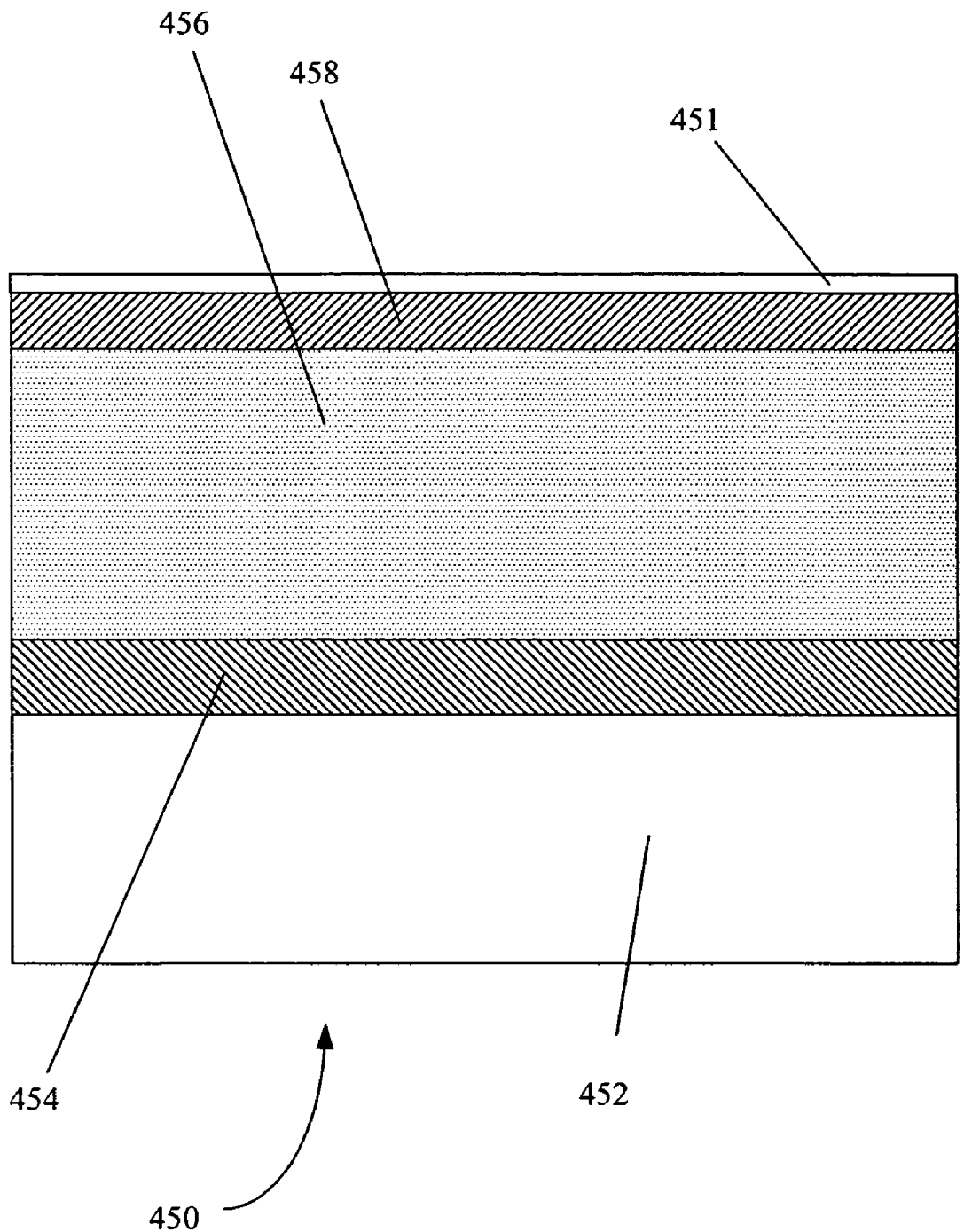
FIG. 4A is a cross-section of a media device in accordance with an embodiment of the present invention in an unwritten state.

FIG. 4A is a cross-section of an embodiment of a media device 450 in an unwritten state for use with systems and methods in accordance the present invention. The media device 450 includes a substrate 452, for example comprising silicon, an under-layer 454 formed over the silicon substrate, a phase change layer 456 formed over the under-layer 454, and optionally an over-layer 458 formed over the phase change layer 456. The under-layer 454 can comprise a highly conductive material, thereby drawing heat away from the phase change layer 456, facilitating fast cooling of the phase change layer 456. In an embodiment, the under-layer 454 can comprise tungsten, while in other embodiments the under-layer 454 can comprise one or more of platinum, gold, aluminum, and copper. In still other embodiments, the under-layer 454 can comprise some other material having high conductivity. One of ordinary skill in the art can appreciate the myriad different materials for forming the under-layer 454. Where it is desired that the under-layer 454 be insulated from the substrate 452, there may be an inbetween layer of insulator between the under-layer 454 and the substrate 452. For example, in an embodiment the inbetween layer can comprise one of an oxide and a nitride material, thereby insulating the media 456 from the substrate 452.

Where an over-layer 458 is included in the media device 450, the over-layer 458 can comprise a material different from that of the phase change layer 456, and may be selected to prevent physical damage to the phase change layer 456 and/or the tip 442 when the tip 442 contacts the over-layer 458. The over-layer 458 can comprise a material that is resistant to wear, thereby extending the lifetime of the over-layer 458 and/or the tip 442. The over-layer 458 typically includes a low conductance characteristic, and a high hardness characteristic. For example, in an embodiment the over-layer 458 can comprise titanium nitride (TiN), a hard material that conducts poorly. However, it should be noted that it can be advantageous (as described in detail below) to employ an anisotropic columnar material that conducts current more readily through a film than across a film. TiN is one such anisotropic columnar material. In another embodiment, the over-layer 458 can comprise diamond-like carbon (DLC). The conductivity of diamond-like carbon can be adjusted in the manufacturing process through a variety of techniques. One such technique includes using a dopant such as nitrogen in the formation of the diamond-like carbon. In still another embodiment, the over-layer include molybdenum nitride (MoN), another such substantially anisotropic columnar material. Many different metal nitrides can be used.

In yet another embodiment of a media device 450, the over-layer 458 can comprise an insulator. For example, the over-layer 458 can comprise silicon nitride (SiN) or oxide. Where an insulator is used as an over-layer 458, current applied to the media device 450 from the tip must tunnel through the over-layer 458 before reaching the phase change layer 456. Thus, in one embodiment, the insulator used for over-layer 458 is thin (relative to the phase change layer 456), thereby reducing the amount of tunneling required before a current can interact with phase change layer 456. In another embodiment, the insulator for over-layer 458 is an oxide.

In yet a further embodiment the over-layer can comprise a cermet-like material. Cermets are combinations of ceramic insulators (commonly dielectrics) and metal conductors that form a matrix. The matrix can have a concrete-like structure, where the metal is analogous to rocks in concrete and the dielectric is analogous to the "glue" that holds the rocks together. It can also have a columnar structure much like TiN. Either form will allow a relative anisotropic conductivity such that the current will preferably flow through the film rather than flow laterally across the film. In still other embodiments, the phase change material can be replaced with a cermet that comprises a phase change material as a conductor, surrounded by a matrix of an insulator. In still other embodiments, the phase change layer can consist of isolated dots, surrounded by an insulator. In alternative of such embodiments, the phase change layer can have discrete conductors over the dots, not electrically connected with adjacent dots. In still other embodiments, the over-layer can consist of a material that exhibits non-linear conductive properties with voltage, particularly those that have increasing conductivity with higher voltage potential. Such materials include tin oxide (SnO). In still another embodiment, the over-layer can comprise a material that exhibits non-linear conductive properties with temperature, particularly those that have increasing conductivity with higher temperature. Such materials include many semiconductors such as silicon. Many of these alternative materials can be used together such that the combination increases the anisotropic conductivity characteristic of the over-layer. Further, these over-layer materials can be used sequentially, rather than mixed together, to enhance the performance characteristics of the over-layer. For example, a very thin layer of carbon can be added over TiN to form a barrier to oxidization, as well as to improve lubricity of the surface.

In some embodiments of a media device 450, the phase change layer 456 comprises a phase change material. The phase change material can include, for example, germanium (Ge), antimony (Sb) and/or tellurium (Te) (such phase change materials are commonly referred to as chalcogenides). As a portion of the phase change material is heated beyond some threshold temperature and then cooled very quickly (i.e., quenched) the phase of the material changes from a crystalline state to an amorphous state. Conversely, if the phase change material is heated above some threshold and then allowed to cool slowly, the material will tend to re-crystallize. As a result of these phase changes, the resistivity of the material changes. This resistivity change is quite large in phase change materials and can be easily detected by a tip that is conductive or that includes a conductive coating by passing current through the tip 442 and the media device 450. Phase change materials are well known in the art and can be found disclosed in numerous references, for example U.S. Pat. Nos. 3,271,591 and 3,530,441 both issued to Ovshinsky and incorporated herein by reference. In other embodiments of the media device 450 the phase change layer 456 can be substituted by a magneto-optic material.

In addition to an over-layer 458, a media device 450 can optionally include a lubricant 451 that is formed, deposited, adhered, or otherwise placed, positioned or applied over the over-layer 458. In some embodiments, the lubricant 451 can be a liquid. In other embodiments, the lubricant 451 can be a non-liquid, such as molybdenum disulfide. In another embodiment, the lubricant 451 can be a form of carbon. The lubricant 451 can be applied to an over-layer 458 using myriad different techniques. In an embodiment, the lubricant 451 can be deposited on the over-layer 458 using a deposition process. In another embodiment, the lubricant 451 can be sprayed onto the over-layer 458. One of ordinary skill in the art will appreciate the myriad different lubricants that can be employed to provide a desired relationship between a tip and a media device 450, and the myriad different techniques for applying such lubricant 451.

The media device 450 can be formed using traditional semiconductor manufacturing processes for depositing or growing layers of film in sequence using deposition chambers (e.g., chemical vapor deposition (CVD) chambers, plasma vapor deposition (PVD) chambers) and/or furnaces, for instance. Alternatively, the media device 450 can be formed using a shadow mask. Where a shadow mask is used, a mask wafer that contains at least one aperture is placed over a final wafer to form a media device 450. The mask wafer and final wafer are then subjected to a deposition process. During the deposition process, chemicals pass through the shadow mask and are deposited to form a media device 450. Additionally, the media and/or media stack can be deposited over a lift-off resist layer. The resist layer and excess media stack can be removed by placing a waver on which the media device 450 is formed in a solvent bath that dissolves the resist and allows excess material to be removed. One of ordinary skill in the art can appreciate the myriad different techniques for forming a media device 450.

Figure 4B:
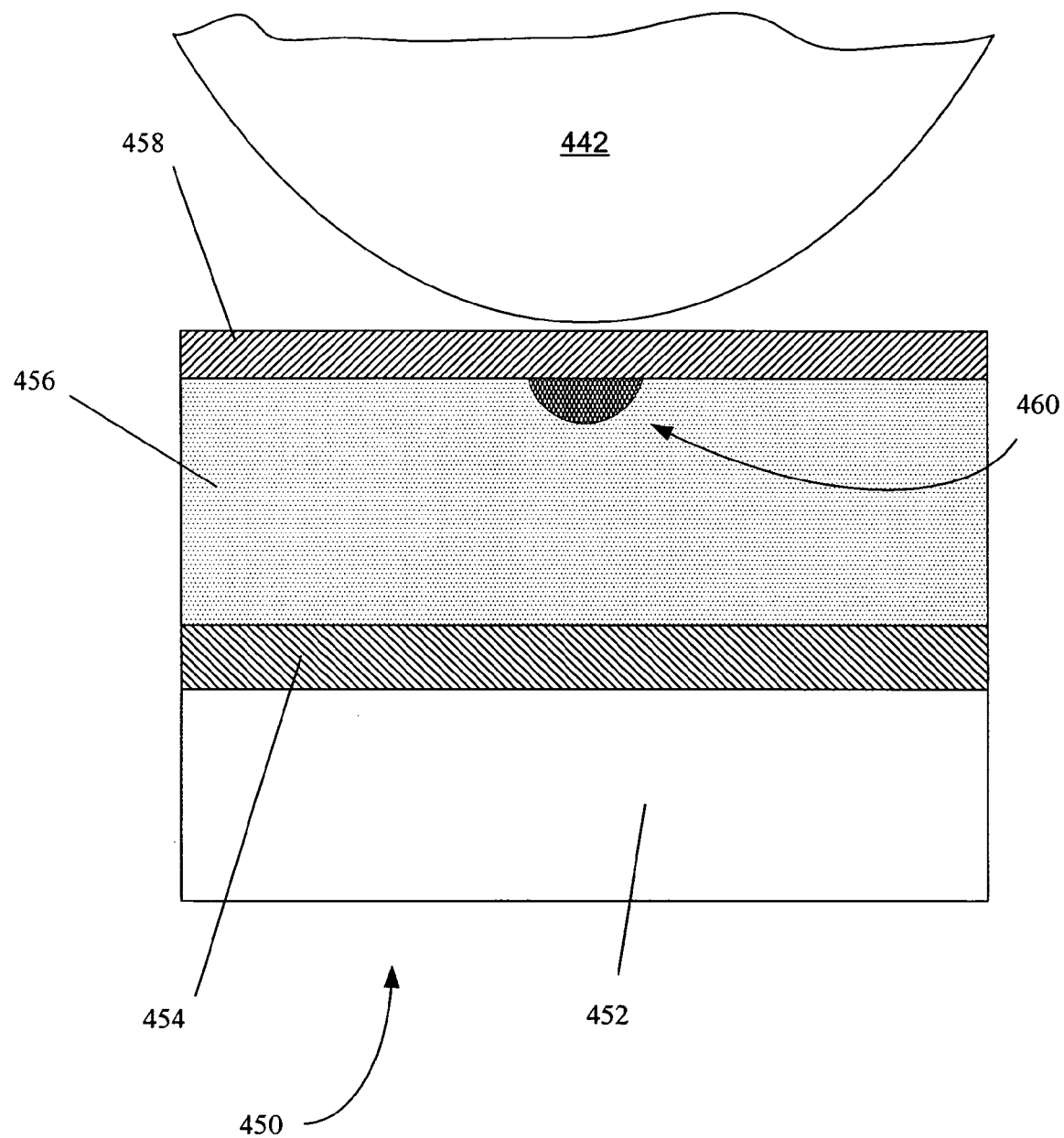
FIG. 4B is a cross-section of the media device of FIG. 4A including a data bit written to a phase change layer of the media device.

FIG. 4B is a cross-section of the media device 450 of FIG. 4A in which an indicia 460 (which can represent a data bit, and which for convenience is referred to herein as a data bit) has been formed. In an embodiment a data bit 460 can be formed by passing current through the phase change layer 456 from a tip 442 positioned in contact or near contact with the over-layer 458, thereby heating the phase change layer 456 near the tip 442. As described above, when the temperature of the phase change layer 456 exceeds a threshold temperature the phase change layer 456 becomes semi-molten or molten, and can be quenched to form an amorphous bit. In other embodiments, the bulk phase change layer 456 can have an amorphous structure and when heated can be more slowly cooled to form a crystalline structure. Quenching is defined as a rate of cooling that achieves an amorphous structure, or a partially non-crystalline structure, from a molten or semi-molten phase change material. Cooling, slow cooling, or simple cooling is defined as a rate of cooling that is slow enough that the phase change material forms a crystalline structure from a molten or semi-molten material. In an embodiment, quenching can be achieved by removing current from the heated portion, and allowing a conductive under-layer to remove heat from the heated portion, while simple cooling can be achieved by ramping down current from the heated portion and allowing the conductive under-layer to remove heat from the heated portion. In other embodiments, quenching can be achieved by not only removing current, but by diverting current from the heated portion via a clamp (described below), while simple cooling can include removing current from the heated portion. An exact technique for achieving quenching can depend on the phase change material, the conductivity of the under-layer, and the temperature to which the portion is heated, as well as environmental and other factors. Further, where multiple resistivity states are used (i.e., data is stored in a non-binary fashion), cooling and quenching can have varying cooling rates and can be combined with heating temperature to achieve multiple different resistivity states as desired and designed.

In a binary system, the data bit 460 has an incongruous resistance relative to the surrounding bulk phase change layer 456, the incongruity representing data stored in the media device 450. To erase the data bit 460 from the media device 450, a second current is applied to a portion of the phase change layer 456 that includes the data bit 460 to heat the portion and properly cool the portion to form the structure of the bulk phase change layer 456 (whether amorphous or crystalline). The resistivity of the data bit 460 is consequently changed to that of an unwritten state. For example, where the bulk phase change layer 456 has an amorphous structure, a crystalline bit 460 can be erased by heating a portion of the phase change layer 456 containing the crystalline bit 460 to a second, higher temperature than was applied to form the crystalline bit 460. The portion is then quenched to ambient temperature, thereby causing the portion to form an amorphous structure having a resistivity similar to the original resistivity of the bulk phase change layer 456.

For example, in an embodiment of the media device 450 in accordance with the present invention the phase change layer 456 can comprise a chalcogenide. The bulk of the phase change layer 456 can have a crystalline structure, and can correspond to an unwritten state. To set the data bit 460 to a written state, a first current can be applied to a target portion of the phase change layer 456 causing the portion of the phase change layer 456 to heat to a threshold temperature (which can be a melting temperature of a phase change material), which in one embodiment of a chalcogenide can be approximately 600° C. The phase change layer 456 can be quenched to ambient temperature, and the portion of the phase change layer 456 heated to the threshold temperature will have a resistivity higher than the bulk, unwritten phase change layer 456, thereby forming an indicia that can be interpreted as a data bit 460. In such an embodiment, quenching can be achieved by removing the first current at a rate ranging from 10 to 100 nanoseconds although the rate can vary substantially. To reset the data bit 460 to an unwritten state (also referred to herein as a reset state, and an erased state), a second current can be applied so that the portion of the phase change layer 456 is heated to a temperature approximately equal to a temperature ranging from 170° C. to 250° C. (or greater, including up to the threshold temperature). (The temperature range can depend on the composition of the chalcogenide, and in some embodiments can have some other range, such as from 100° C. to 250° C., or greater.) As the portion of the phase change layer 456 cools to ambient temperature, a data bit 460 forms having a crystalline structure, the crystalline structure having a resistivity that approximates the resistivity of the bulk, unwritten phase change layer 456. Different materials can be used for the phase change layer 456 to adjust the operating range for writing and erasing a data bit 460. Altering the proportions of the elements in a chalcogenide is one way of altering the written and erased temperatures.

It should be noted that although temperatures have been described with some level of specificity, the state of the portion to which heat is applied is generally most influenced by a rate of cooling of the portion. A rate of cooling can be influenced by a rate at which the current through the heated portion is removed from the heated portion, and how quickly the heat can be carried away from the heated portion (i.e., the conductivity of the materials of the media device 450 stack). It is largely thought that where a minimum temperature is reached (i.e., the crystallization temperature, which in the embodiment described above is approximately 170° C.) and maintained, the material can be cooled slowly enough that the material can re-crystallize. Such cooling can be achieved using a number of different techniques, including ramping down a current applied to the heated portion. In some embodiments, the current can be ramped down in stages, and the heated portion can be maintained at desired temperature levels for desired times, so that crystallization is achieved across substantially the entire portion. One of ordinary skill in the art can appreciate the different applications of phase change layer 456 and the techniques for achieving changes in material properties of the phase change layer 456.

In other embodiments, the phase change layer 456 can comprise a chalcogenide, the bulk of which includes an amorphous structure corresponding to an unwritten state. In such embodiments, targeted portions of the phase change layer 456 can be heated and slowly cooled so that the portion crystallizes, forming an indicia that can be interpreted as a data bit 460 having a written state. Systems and methods in accordance with the present invention should not be interpreted as being limited to the conventions disclosed herein or the temperature range or material characteristics described. Systems and methods in accordance with the present invention are meant to apply to all such applications of phase change layer 456 having indicia corresponding to material property.

As described in the embodiment above, to erase an amorphous data bit 460, a second current can be applied to the portion of the phase change layer 456 including the data bit 460. As the portion cools, the resistivity of the portion returns to a value approximately equal to the original value of the bulk phase change layer 456, thereby erasing the data bit 460. Multiple data bits 460 can be reset to an unwritten state by applying heat to a large region of the media device 450. For instance, the media device 450 can apply a current to a buried heater under the media device 450. This heating can be applied to all of the memory locations in the media device 450 or a portion of the media device 450 such that the resistivity of heated portion of the phase change layer 456 is returned to an unwritten value. For example, in an embodiment strip heaters can be positioned to heat up bands within the media device 450. In still other embodiments, a laser can be applied to at least a portion of the media device 450 to heat the portion. For example, where the platform 108 comprises a transparent material, such as silicon dioxide, a laser can be applied through the platform 108 to heat one or more media devices 450 on the media platform 308. In still other embodiments, a matrix of diode heaters can be formed to selectively heat portions of a media device 450. Such bulk erasing can add complexity to one or both dies 100,300 but can potentially provide benefits such as reduced tip wear.

In still another embodiment of a media device 450 in accordance with the present invention, the phase change layer 456 is capable of having a plurality of resistivity states. For example, in the unwritten state, the phase change layer 456 can have a first resistivity. The phase change layer 456 can then be heated to different temperatures and quenched, thereby changing the resistivity of the phase change layer 456. In an embodiment, a read voltage can be applied across a tip and phase change layer 456 to sense whether the resistivity of the phase change layer 456 is at or near the initial, unwritten state for the bulk phase change layer 456 or at some state that is sufficiently different to be measured as a state other than the unwritten state. The phase change layer 456 can have a first resistivity characteristic at an initial, or unwritten state. A first current can then be applied to the phase change layer 456, heating the phase change layer 456 to a first temperature. The first current can be removed from the phase change layer 456 and the phase change layer 456 cools to form a structure having a second resistivity characteristic. In an embodiment, the resistivity of the phase change layer 456 in this second state can be measured. The second resistivity can vary depending on the temperature that the phase change layer 456 is heated to by the first current, and the cooling time of the phase change layer 456. A range of resistivity measurements can correspond to a data value, with different ranges corresponding to different data values. A plurality of resistivity ranges can be employed as a plurality of data values using a data storage scheme other than binary, for example. In an embodiment, a data storage scheme including three data values can utilize a base-3 system rather than a binary system for storing data. In another data storage scheme, where four different resistivity states are possible for each data bit, each data bit can correspond to two bits (e.g., each can correspond to 00, 01, 10 or 11). Alternatively, the precise value of the resistivity characteristic for phase change layer 456 can be measured for more precise analog data storage. Measurements of the resistivity are preferentially obtained by taking measurements which are relative to a first state of the media, but can also be obtained by taking absolute value measurements. Another method of measurement extracts the data as the derivative of the measured data.

The phase change layer 456 can posses a large dynamic range for resistivity states, thereby allowing analog data storage. The dynamic range for the resistivity characteristic of the phase change layer 456 can be approximately 3 to 4 orders of magnitude (i.e., 1000-10,000×). For example, the resistivity can range from lower than 0.1 ohm-centimeters to 1000 ohm-centimeters or more. In one embodiment, however, heating from the probe on the phase change material can cause only a very small area of media 456 to undergo a change in its resistivity. In this form a smaller dynamic range may be observed, as only a small region of the media is altered. Media systems typically display a range of values in the initially deposited state, such that the resistance values measured vary at different locations. Additionally, variations in the thickness of the phase change material and the over-layer can form differences in the measured resistance as sensed through a tip. These differences manifest as noise in a signal read from the tip. One method of reducing noise uses the analog nature of the recording medium. The state of the media under the tip can be detected by means described elsewhere. A voltage waveform is then applied to the tip to heat and cool the media such that the media changes state. The media under the tip is then read again. If the value is not within the desired noise tolerance for the location, another voltage waveform is applied to change the value to within the desired tolerance range. The waveform can consist of a crystalline pulse or an amorphizing pulse, or some combination of such pulses. Multiple cycles of reading and writing can be used to drive the value to the desired tolerance range. In this way, the media can be adaptively written to reduce noise in the subsequent read back signal. Alternatively, the waveforms used to drive the recording medium to a desired state can operate during the heating and cooling process itself by measuring the resistance state while heating and cooling.

In other embodiments, the media 456 can be a material other than a phase change material. For example, the media device 450 can include a charge storage-type media. Charge storage media store data as trapped charges in dielectrics. Thus, for charge storage media, the media 456 would be a dielectric material that traps charges when in a written state. Changing the media 456 back to an unwritten state simply requires the removal of the trapped charges. For instance, a positive current can be used to store charges in the media 456. A negative current can then be used to remove the stored charges from the media 456.

Super Resolution Writing and Reading

A tip formed as described above can include a distal end having a radius of curvature of about 25 nm, in one embodiment. As the tip moves across the media surface, in contact or near contact with the surface, the tip wears such that after some initial period the nominal radius of curvature of the distal end ranges from 50 to 100 nm (or more), in one embodiment. A voltage is applied across the media to form domains of low (or high) resistivity. The distal end of the tip is typically not completely flat, therefore the distal end is likely not in uniform contact or near-contact with the phase change material (or the over-layer where present). The portion of the distal end in contact or near-contact with the phase change layer is limited by the radius of curvature of the distal end. The portion of the tip in contact or near contact is also referred to herein as the terminus of the tip. It should be noted that while the distal end is described as having a radius of curvature, the distal end need not be shaped so that the terminus lies along a perfect arc. The radius of curvature can be thought of as an increase in width of the distal end of the tip from the terminus, and as referred to herein is not meant to be limited to geometries wherein a distal end includes a smooth, arced shape. The distal end can, for example, have a parabolic shape, a trapezoidal shape, or a non-uniform shape. The tip is electrically conductive, and when a voltage potential is applied between the tip and the media, current passes from the tip, through the over-layer and media to the underlying substrate (in the case where the tip is a voltage source rather than a voltage sink). The current flowing between the media and tip varies across the radius of curvature as the electric field between the tip and the media decays inversely with distance from the surface of the phase change layer.

Figure 6:
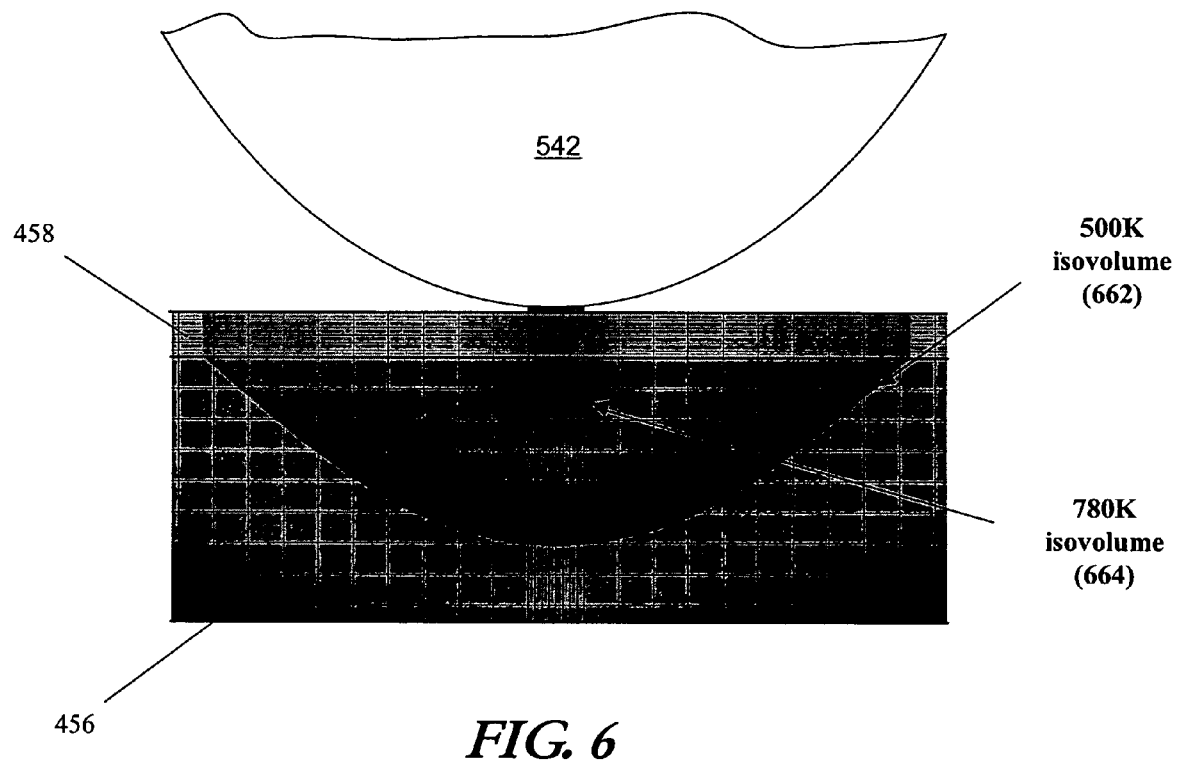
FIG. 6 illustrates heating characteristics of the media device of FIGS. 4A and 4B.

The current passing from the tip to the media heats the phase change layer near the tip. The phase change layer, the over-layer, the phase change layer/over-layer interface and the tip/over-layer interface act as resistors. As the voltage potential across the media increases, the current increases, and the temperature of the phase change layer increases. FIG. 6 is a first order model of the heating characteristics of an exemplary media as a voltage potential is applied across the media in accordance with an embodiment of the present invention. The exemplary media includes a film stack comprising a titanium nitride over-layer 458 deposited over a phase change layer 456. The heat generated by the current can be distributed in a substantially parabolic fashion from the contact or near contact point of the tip 542 and the media surface. A small portion of the media 450 near the surface of the film stack (the first isovolume 664) is heated above 780 K, and the material surrounding the first isovolume 664 to the second isovolume 662 ranges from 780 K to 500 K. The portion of the phase change layer 456 heated above about 575 K, in one embodiment, becomes molten. If the bulk phase change layer 456 is amorphous, the molten portion can be cooled slowly to form a crystalline structure having a relative resistivity orders of magnitude lower than a resistivity of the bulk phase change layer 456. If the bulk phase change layer 456 has a crystalline structure, the molten portion can be quenched quickly, causing the molten portion to become predominantly amorphous and to have a relative resistivity orders of magnitude higher than the resistivity of the bulk phase change layer 456. The temperature achieved during heating, and the cooling characteristics depend on the composition of the phase change layer 456, and can vary greatly.

As can be seen in FIG. 6, the portion of the phase change layer 456 heated to a molten state, and thereafter properly cooled to form a domain having a resistivity substantially different than the bulk material can be substantially small in width relative to the radius of curvature of the tip 542. For example, where methods in accordance with the present invention are applied to create a voltage potential between the phase change layer 456 and the tip 542, it has been demonstrated that a tip 542 having an approximate radius of curvature ranging from 50 nm to 100 nm can produce a domain having a width of approximately 15 nm. The domain can be said to be "super resolved." Such super resolution can result in part from properties of the over-layer, which can be an anisotropic columnar material (e.g., TiN, microcrystalline silicon) that conducts better through the film rather than across the film. This property can focus electron flow near the center of the tip. Further, a portion of the phase change layer 456 near the center of the tip 542 is heated first, the portion consequently exhibiting lower resistance than the surrounding media, even the unheated crystalline material. Electron flow follows the lowest resistance, and thus the electron flow is further focused.

The amount of focusing of the current through the phase change layer 456—and thus the size of the domain that results—can vary with the voltage potential across the phase change layer 456 and the pressure between the tip 542 and the surface of the media. The voltage potential can determine the size of an air gap across which the current can arc, and current may or may not flow between the tip 542 and the phase change layer 456 where an air gap exists (i.e. where the tip is not in direct contact with the media due to curvature). The pressure applied by the tip 542 against the surface can likewise affect the portion of the tip 542 in direct contact with the surface and a size of the air gap where the tip curves away from the surface.

Once a domain has been defined within the phase change layer 456, the resistivity of the domain can be measured by applying a smaller voltage potential across the portion of the media including the domain (e.g., in one embodiment less than 1 volt) and measuring the current through the portion. The small voltage potential drives a small current, insufficient to heat the portion to a crystallization or threshold temperature. Thus, the resistance (and resistivity) of the portion including the domain can be measured without substantially heating the phase change layer 456 and causing the electrical characteristics of the phase change layer 456 to be altered.

Figure 7A:
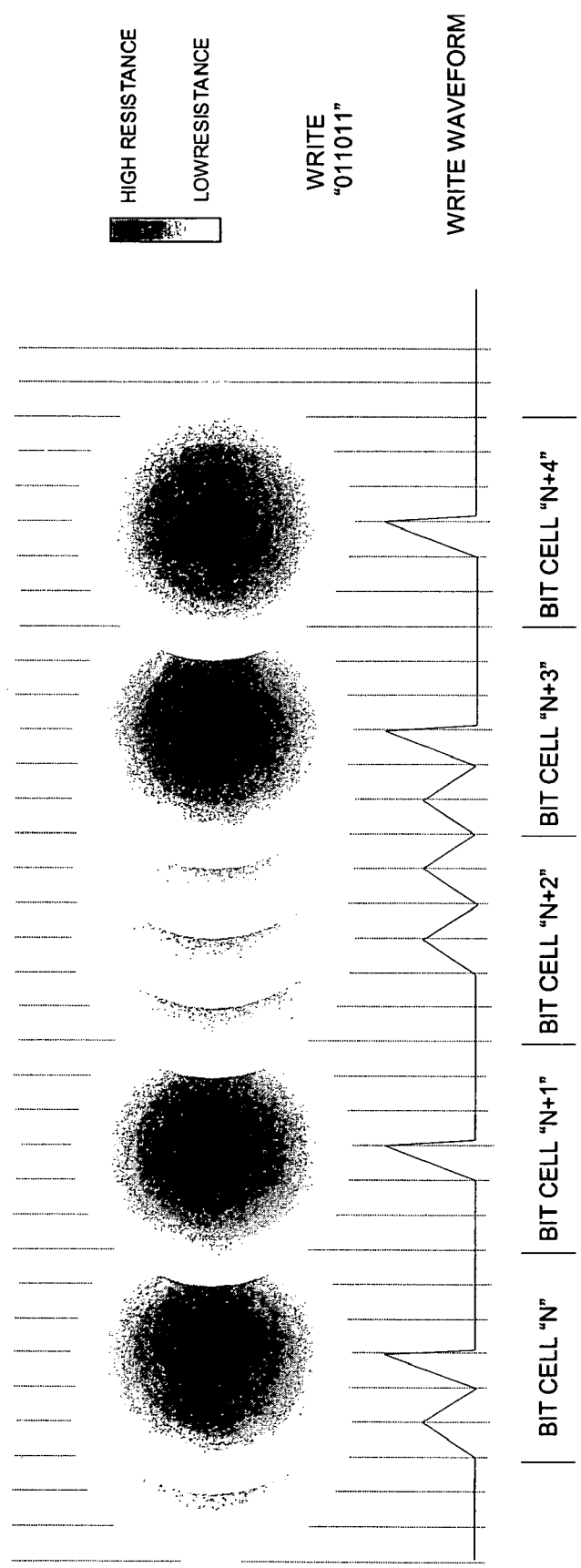
FIG. 7A is a top view, grayscale map of a sequence of bits written to a portion of a media device including a corresponding write waveform.

Methods and systems in accordance with embodiments of the present invention can be applied to form a plurality of bit cells comprising one or more domains in a phase change layer 456. The plurality of bit cells can be arranged in predefined proximity to one another and in any order, so long as a technique can be employed to locate a desired bit. For example, in one embodiment the bit cells can be arranged in rows. FIG. 7A illustrates one embodiment of a method for forming and arranging bit cells. As shown, a "1" is represented by a domain having a high resistance. The bulk phase material 456 preferably has an initially crystalline structure. When a command is received to write a string of bits, in this example "011011", the tip 542 is moved across the media surface (from left to right in the figure) and moved within each bit cell to apply an appropriate current to form the desired value within the bit cell. The bulk phase change material 456 can have a nominal "0" or "1" state depending on the structure of the phase change layer and the convention of indicating a "0" or "1". Assuming, for this example, that a domain having a low resistance indicates a "0", and that the bulk phase change material 456 is in a crystalline state, if the series of bit cells have not been used to store data, each bit cell will have a uniformly low resistance, indicating "0" values. However, more likely the bit cells will have been used to store data.

To overwrite the bit cells, the tip 542 can perform overlap writing to ensure that where a "0" is written the phase change material 456 is sufficiently phase changed, which can allow the bit cells to be positioned more closely together. In part, an overlap strategy for writing a "0" can reduce concern that an insufficiently large crystalline domain is formed. A write "0" voltage potential is typically smaller than a write "1" voltage potential, and when applied across the media less current flows through the targeted portion of the media device 450 (this can result also from a high resistance state of the phase change material). Thus, where overlap writing is not performed, an insufficiently large domain can result because less phase change material is phase-changed. A read voltage applied to the tip 542 is smaller still than the "0" write voltage and has a narrow current path (relative to the domain), allowing a finer resolution during read (resulting, effectively, in a write wide/read narrow scheme).

Also, in part or in whole, overlap writing can be performed to improve crystallization of a targeted portion of the phase change layer 456. An amorphous domain has high resistance, causing current to follow an electrical path around the edge of the amorphous domain. As a result, the amorphous domain is prevented from sufficiently heating, and crystallization and erasure of the amorphous domain does not desirably occur. Such a result can be advantageously avoided by "dragging" the tip 542 from an at least partially crystalline region and through the amorphous domain. The tip 542 can be arranged at the edge of the amorphous domain in the crystalline region and repositioned along a path through the amorphous domain while applying a voltage across the media device 450. For example, in an embodiment a plurality of pulses can be applied to the media device 450 as the tip 542 is repositioned from the crystalline region across the amorphous domain. It is believed that applying a series of pulses perpetuates a heat wave front, thereby improving crystallization of the amorphous domain. It is known that starting a crystallization process in an amorphous structure can require an unacceptably long time delay before nucleation occurs and crystallization subsequently follows. Such delay can be unacceptable where media surrounding the targeted domain is undesirably heated, or where write times are unacceptably long. Positioning the tip 542 over a location where nucleation has been, or can easily be, achieved can allow crystallization to occur more rapidly. Repositioning the tip 542 while applying a voltage across the media 450 can propagate nucleation sites and/or the crystallized region within the phase change layer. Such propagation can be said to result from one or both of "pushing" the wave front of crystallization away from the tip 542, effectively pushing crystallization along ahead of the tip 542, or "pulling" the crystal structure formed at nucleation sites through the amorphous domain along with the tip 542. It should be noted that other mechanisms may be involved in crystallizing the amorphous domain, and embodiments of the present invention are not meant to exclusively apply the mechanism described herein. Rather, embodiments of the present invention are meant to capture all such methods wherein an amorphous domain is crystallized by actively moving a tip 542 across the amorphous domain beginning from an at least partially crystallized region, while applying a voltage potential across the media device 450. It should also be noted that in alternative embodiments of a method in accordance with the present invention, a plurality of pulses need not be applied across the media device 450. For example, in some embodiments a constant voltage potential can be applied to the media device 450 while the tip 542 is repositioned. In still other embodiments, a waveform other than a pulse can be applied to the media device 450 as the tip 542 is repositioned. For example, the waveform can be a ramp, a saw-tooth, a trailing edge, etc. One of ordinary skill in the art can appreciate the myriad different methods of applying voltage to the media device 450 to heat the media device 450 as the tip 542 moves over the surface of the media device 450.

Referring to FIG. 7A, the tip moves across the surface continuously from left to right writing a "1" or a "0". The write waveform plot indicates an action of the tip as a function of tip position. For example, in bit cell N, a "0" is written in the first part of the bit cell to crystallize any amorphous material. To write the "0", a voltage is ramped across the phase change layer to a first potential, heating the phase change layer proximate to the tip to at least the crystallization temperature. The voltage is ramped down, allowing the phase change layer to crystallize. The "0" is followed and overlapped by a "1", written by ramping the voltage to a second potential, higher than the first potential, heating the phase change layer proximate to the tip to at least the threshold temperature. The voltage is removed so that the molten material is quenched to form a high resistance, amorphous domain. The tip then continues moving to the center of bit cell N+1, and again writes a "1". The tip then moves to bit cell N+2 and writes two consecutive "0" domains to ensure that the phase change layer in bit cell N+2 is crystallized, and a third consecutive "0" domain preceding a "1" written to bit cell N+3. The tip is then repositioned to bit cell N+4, where the final "1" is written.

Figure 7B:
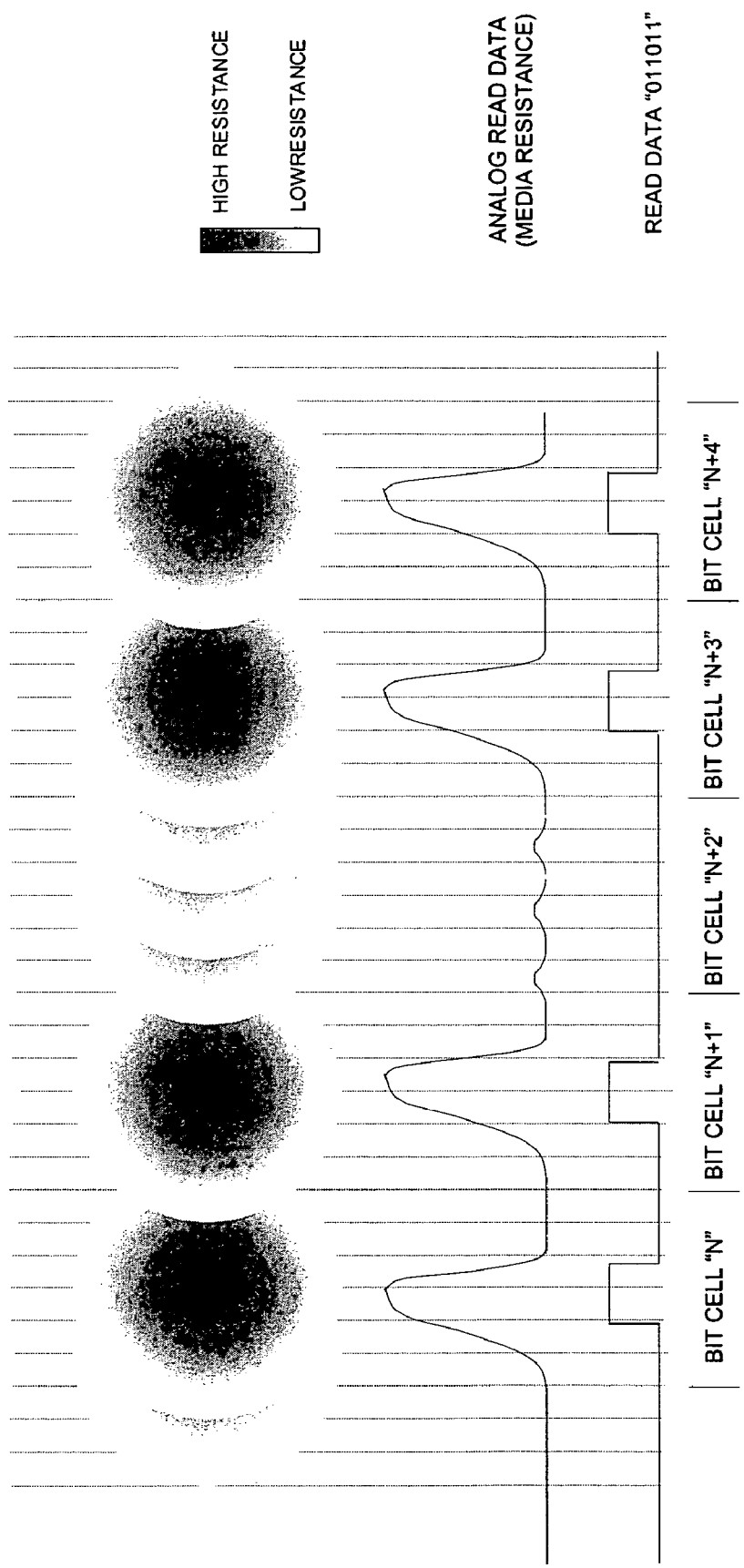
FIG. 7B is a top view, grayscale map of the sequence of bits of FIG. 7A including a corresponding analog read data signal and a digital conversion of the analog read data signal.
Figure 7C:
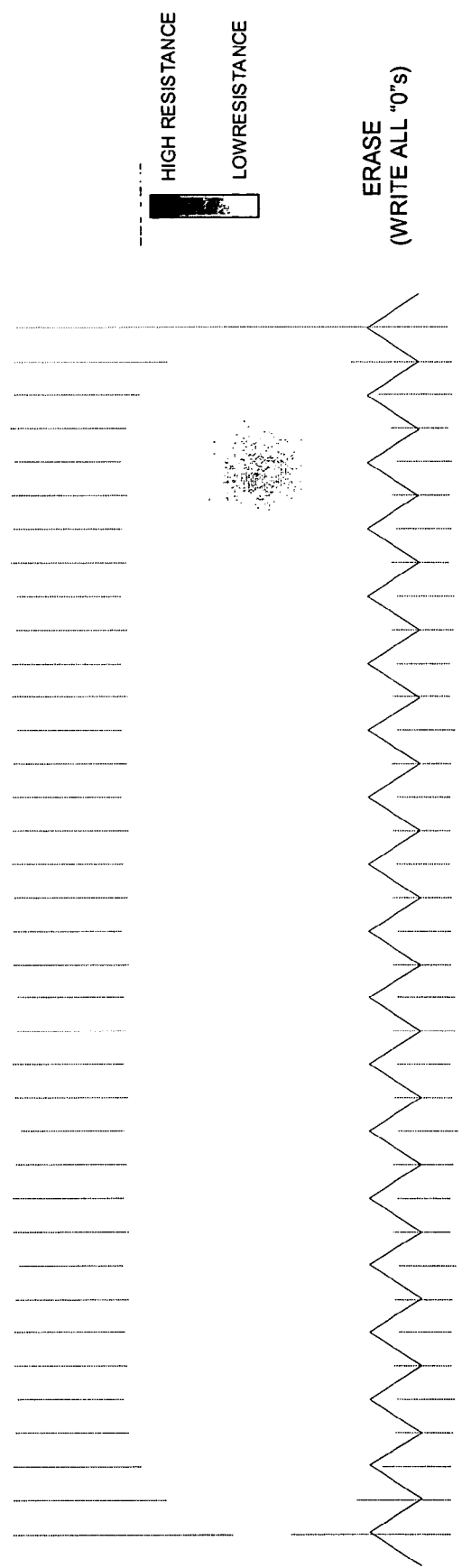
FIG. 7C is a top view, grayscale map of an erase sequence to erase the sequence of bits of FIGS. 7A and 7B, including a corresponding write waveform.

The final written series of bits can be discerned in FIG. 7A from a grayscale pattern of resistance, with darker portions corresponding to higher resistance and a gradient corresponding to a gradient of resistance. Positioning the tip over a written bit and applying a voltage potential across the media can produce an analog resistance measurement correlated to a digital value. Referring to FIG. 7B, a tip applying a low voltage potential between the tip and media can produce analog read data of measured resistance as the tip moves along the media surface and over the bits. The digital equivalent, as read for example by a PRML channel interprets the string "011011", with resistance peaks corresponding to "1" measurements. A media can be formatted or cleared by erasing all data written to the media, in a similar fashion as described above. To wit, a string of overlapped "0" domains can be written by ramping the voltage to the first voltage and ramping down the voltage to slowly cool the phase change layer, forming a crystalline structure having low resistance, as shown in FIG. 7C.

Read/Write Circuitry

Figure 8:
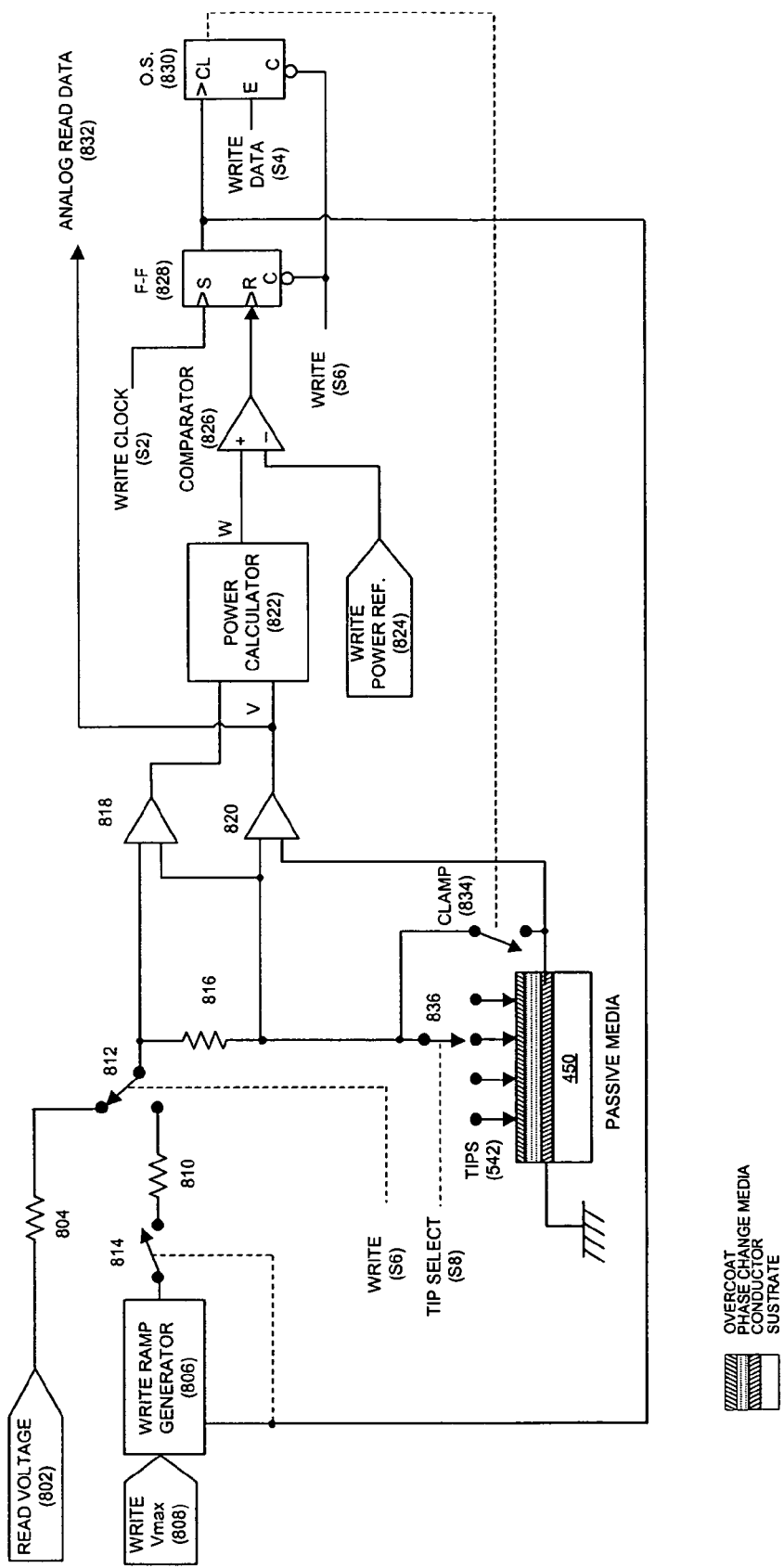
FIG. 8 is a circuit diagram of a read/write circuit in accordance with an embodiment of the present invention.

FIG. 8 is a circuit diagram of a read/write circuit 800 in accordance with an embodiment of the present invention which can deliver an amount of power (or energy) to a passive media 450 to heat the media 450, thereby changing the phase of a portion of the media 450 from a crystalline state to an amorphous state (or vice-versa). As described above, the passive media 450 comprises a substrate and a film stack deposited or grown over the substrate. The film stack can include a conductor layer contacting the substrate, a phase change layer, an over-layer to protect the phase change layer and tip(s) from damage. A tip 542 is placed in near or actual contact with the media surface when reading and/or writing from the media surface. In an embodiment, one of the tip platform and the media platform is physically positioned below the other of the tip platform and the media platform so that the tips do not contact the media surface until current is applied to the actuators of the lower platform to create tension in the actuators and remove slack (such embodiments are loosely analogous to a hammock that hangs slack, but can be raised when the end ropes are placed in tension). Once current is passed through the positioning actuators of the lower platform, tension is produced in the pull-rods as the pull-rods are drawn to the periphery of the cell. This causes the platform to rise up to meet an opposite platform, contacting tip 542 to media 450. By taking advantage of passive non-contact between the tip platform and the media platform, the complexity of read/write circuitry on a chip-wide scale can be reduced, as well as the complexity of chip packaging (as is described in more detail below). The addressing scheme can be connected with multiple platforms, yet can address one platform at a time by completing a circuit between tip and media platforms.

In still other embodiments, as will be discussed in more detail, the platform can be positioned such that the cantilevers continuously contact the media surface. With the tip platform in near or actual contact, a tip 542 is selected from the tip platform and activated so that current flows through the tip 542. Where all tips of a platform continuously contact a media surface, it can be advantageous to apply current through one of a plurality of tips mounted to the platform. Applying current through multiple tips from a single platform during a write operation, for example, can cause unintended bits to be written or erased. However, the invention is equally applicable to platforms wherein multiple tips can be accessed at a single time.

The activated tip 542 allows current to flow, completing a circuit between a voltage source and the grounded passive media 450. A WRITE signal S6 selectively sets a switch 812 completing the circuit with either a read voltage source which is defined by a read voltage digital/analog converter (DAC) 802, or a write ramp generator 806. Current passes through the circuit and through the passive media 450 at a rate determined by the voltage potential between the voltage source and the grounded passive media 450. A sense resistor 816 is placed in series with the completed circuit between two inputs connected with a first amplifier 818. The first amplifier 818 measures a drop in voltage across the sense resistor 816 and outputs a current measurement to a power calculator 822. A second amplifier 820 measures the voltage drop across the passive media. The output of the second amplifier 820 is fed to both the power calculator and an analog read data channel, such as for example a PRML channel. The two amplifiers together can approximately measure the voltage and current through the passive media. The power calculator 822, in one embodiment a high bandwidth multiplier, calculates the product of the tip current and the tip voltage to determine the power applied to the passive media 450. The product of the current and the tip voltage is further multiplied by a constant, K, and the output is supplied as input to a power comparator 826, along with a power reference signal 824 (i.e., a threshold set by a digital to analog converter, or other means). The power reference signal 824 is determined based on prior knowledge of the media phase change characteristics. The comparator 826 compares the output of the power calculator 822 to the power reference signal 824 and outputs a digital signal to a flip-flop circuit 828. In other embodiments, a desired energy, voltage or current can be targeted. To determine the energy across the circuit, the output of the calculator is provided to a resetable integrator, the output of which is applied to the comparator.

The flip-flop circuit 828 can be a standard bistable flip-flop circuit with "set", "reset" and "clear" inputs and a digital output. For example, in one embodiment the flip-flop 828 can be a commercially available flip-flop circuit, such as an SN7474 circuit. If a pulse is provided to the set input, the flip-flop 828 will be "1" at its output, and if a pulse is provided to the reset input, the flip-flop 828 will be "0" at its output. The flip-flop 828 will ignore all input in a clear state. The clear input is a false term input. The WRITE signal S6 selectively activates a switch setting the voltage source to be either the write ramp generator 806 or the read voltage source 802. When a WRITE signal S6 is false—i.e., the circuit is performing a read—then the flip-flop 828 is in a clear state and the output is "0". When the WRITE signal S6 is true the switch configures the circuit in series with the write ramp generator 806, and the flip-flop 828 is no longer in a clear state. The WRITE CLOCK signal S2 defines the bit cell time and sets the flip-flop 828, initiating the circuit to write. The flip-flop 828 outputs to the write ramp generator 806 and causes the write ramp generator 806 to generate a waveform for writing. The maximum voltage of the write ramp generator 806 is limited by a WRITE Vmax DAC 808. When the calculated power through the passive media 450 exceeds the power reference signal 824, the comparator 826 outputs a "1" to the flip-flop 828, triggering the flip-flop 828 to reset.

The digital output of the flip-flop 828 is sent to a one-shot timer 830 as a clock input. The one-shot timer 830 is a standard circuit having "clock input", "enable" and "clear" inputs. The one-shot timer 830 can be a commercially available circuit, such as an SN74123 circuit. If a WRITE DATA signal S4 is false, then the one-shot timer output is "0", and the clock input is ignored. The clear input is a false term input, as is the clear input for the flip-flop circuit, and when the WRITE signal S6 is true the one-shot timer 830 is no longer in a clear state. Both the WRITE DATA signal S4 and WRITE signal S6 must be true to enable the one-shot timer 830.

When both the WRITE signal S6 and the WRITE DATA signal S4 are true, the voltage source switch is set so that the write ramp generator 806 is in series with a write current limiting resistor 812, the sense resistor 816, and the grounded passive media 450. The active tip 542 can be positioned or moved over the media surface, without drawing significant current. To write a bit, the WRITE CLOCK signal S2 is pulsed, causing the flip-flop 828 to set, outputting a "1" to the one-shot timer 830 and the write ramp generator 810. The write ramp generator 810 ramps the write voltage starting from 0 volts. Ramping the write voltage provides an advantage in controlling the power delivered to the media. For example, ramping can compensate for stray capacitance resulting from a step in sensed current due to the product of the capacitance and the time integral of voltage. The step in sensed current can be calibrated for by adding an offset to the current sense amplifier 818,820. Another advantage of ramping is that the current sense amplifiers 818,820 have lower bandwidths since the power is changing at the ramp rate, resulting in smaller errors in power calculation and consequently in resetting the flip-flop 828 when the power exceeds the power reference signal 824. In other embodiments, the maximum and minimum voltage, and the ramp rate can vary. Note that ramping is not required. In other embodiments the write voltage can be pulsed across the circuit. Similarly, the wave form produced by the wave form generators can vary. For example, the waveform can be triangular or saw-tooth.

As the voltage increases, the current increases and the passive media 450 begins to heat. The calculated power increases, and at some time t, the calculated power is equal to the power reference signal 824. When the power reference signal 824 is reached, the power comparator sends a pulse resetting the flip-flop circuit 828. The flip-flop 828 sends a signal ramping down the write ramp generator 806 and opening a switch 814 between the write ramp generator 806 and the write limit resistor 810, and provides a pulse as clock input to the one-shot timer 830. The one-shot timer 830, enabled by the true value of the WRITE DATA signal S4 and WRITE signal S6, sends a signal activating a clamp 834, which in one embodiment can be a high speed analog switch having a turn off time on the order of 10 ns. The clamp 834 short-circuits the voltage source to the tip 542 through the conductive layer of the passive media 450. With the tip voltage source shorted, current no longer flows through the phase change layer 456, but rather through the grounded conductor layer. The substrate draws heat away from the phase change layer via the conductor, quenching the phase change layer. The speed with which the passive media 450 cools leaves the phase bit in a high resistance amorphous state, thus creating a "1". As described above, in an amorphous state a phase change material does not have free carriers, causing resistance to increase by as much as 1000:1 ratio. Clamping the circuit can decrease cooling time from, in an embodiment, approximately 200 ns to under 5 ns.

Figure 5:
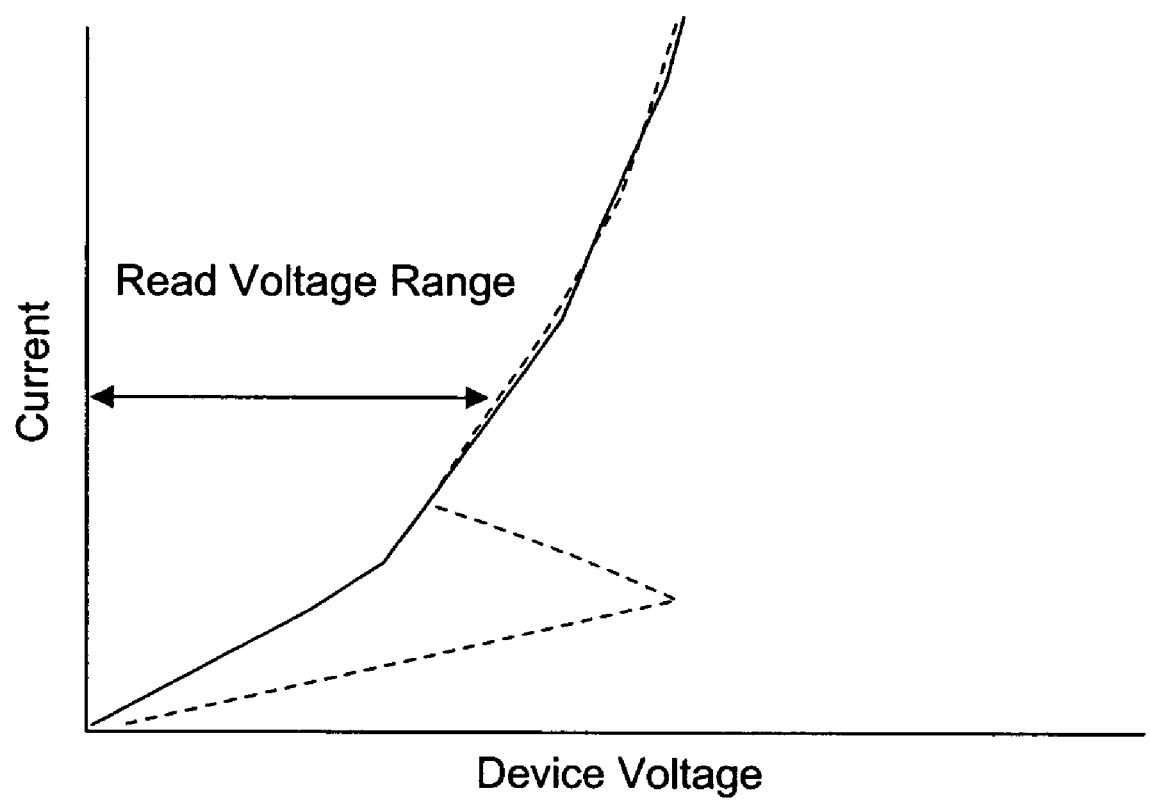
FIG. 5 is a phase change chart of an exemplary phase change material for use with systems and methods in accordance with the present invention.

When the WRITE signal S6 is "1" and the WRITE DATA signal S4 is "0", the circuit is configured to erase or write a "0". When the WRITE CLOCK signal S2 provides a pulse and sets the flip-flop 828, the flip-flop 828 sends a "1" output signal to the one-shot timer 830 and the wave ramp generator 806. The wave ramp generator 806 increases the voltage across the passive media 450 and the sense resistor 816 and the write current limiting resistor 810. The current begins to increase and the passive media 450 begins to heat. Erasing a previously written "1" requires that the phase change layer be heated well into the media's "dynamic on state," and then slowly cooled to form a crystalline state having low resistance. FIG. 5 is a chart illustrating the characteristics of a chalcogenide media device. As can be seen, the voltage ramped across an amorphous region of a chalcogenide must exceed a threshold voltage before the amorphous region can cooled to form crystalline structure. As the current increases, the calculated power increases, and at some time t2, the calculated power is equal to the power reference signal 824. When the power reference signal 824 no longer exceeds the power applied to the passive media 450, the power comparator 826 sends a pulse resetting the flip-flop 828. The flip-flop 828 sends a signal ramping down the write ramp generator 806 and provides a pulse as clock input to the one-shot circuit 830. The output of the one-shot circuit 830, disabled by the false value of the WRITE DATA signal S4, continues to be "0". As the phase change layer region cools—more slowly with the clamp remaining open absent a pulse from the one-shot circuit output—the heated medium crystallizes, creating a "0".

When the WRITE signal S6 is false, the flip-flop 828 is in a clear state, ignoring all inputs. The mode switch 812 configures the circuit so that the read voltage source 802 is in series with a read limiting resistor 804, the sense resistor 816, and the grounded, passive media 450. The voltage across the passive media 450 draws a relatively small amount of current, insufficient to change the material properties of the phase change layer, but sufficient to allow the second amplifier 820 to measure the voltage drop across the passive media 450 and send the output as ANALOG READ DATA signal 832 to a read circuit (not shown). In an embodiment, the read voltage is approximately 1 volt or less, acting as a current source with a voltage ceiling. Reading the media at lower voltages can limit a "tunneling effect" to a smaller tip region close to the media and can provide better resolution. In other embodiments the read voltage can be higher than 1 volt. Where the phase change layer is amorphous, the resistivity of the phase change layer is higher (i.e., in some embodiments four orders of magnitude ($10^4$) higher than the crystalline material) resulting in a larger, detectable voltage drop between the voltage source and the passive media 450. Where the phase change layer is crystalline, the resistivity of the phase change layer is lower.

Figure 9:
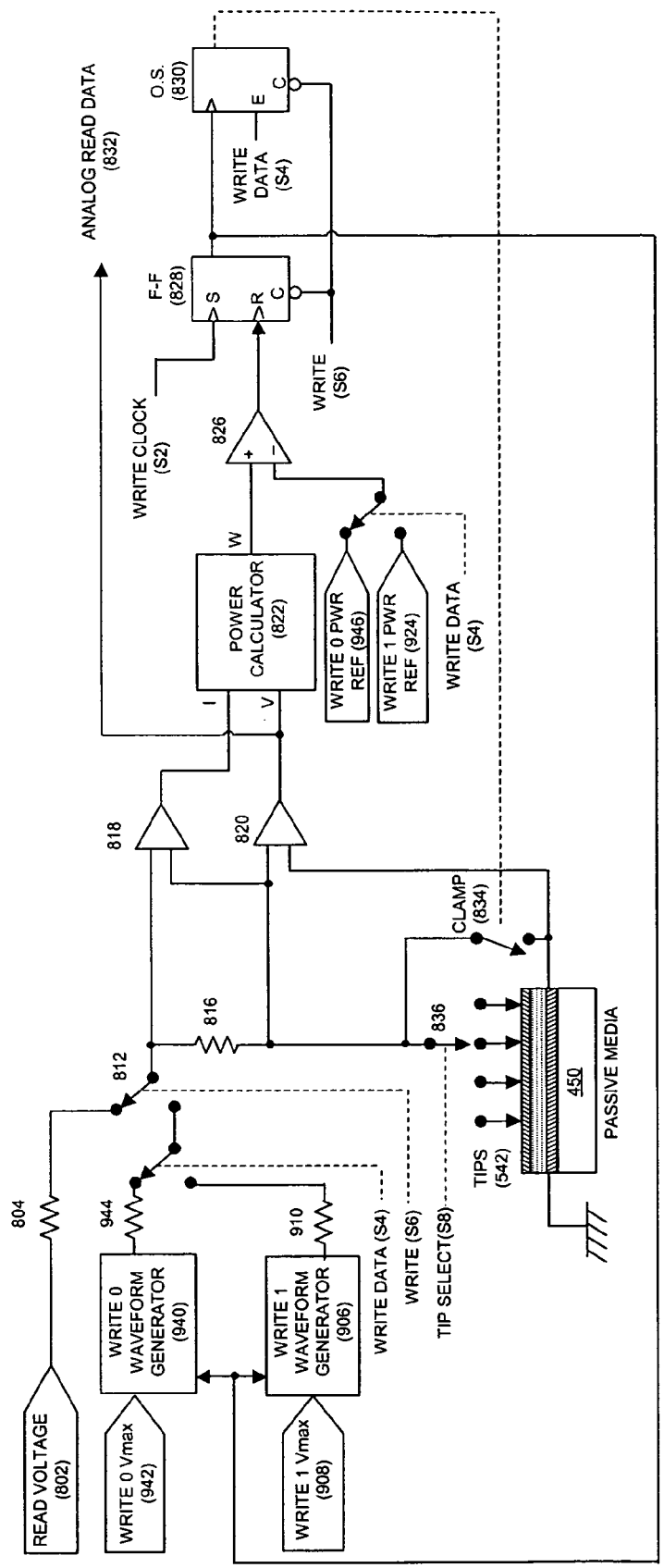
FIG. 9 is a circuit diagram of a read/write circuit in accordance with an alternative embodiment of the present invention.

FIG. 9 is a circuit diagram of an alternative embodiment of a circuit in accordance with the present invention. The circuit includes separate wave form generators and write power reference signals for writing "1"s and "0"s. The WRITE DATA signal S4 further selectively configures the write power reference and wave form generator. When the WRITE DATA signal S4 and the WRITE signal S6 are "1", a wave form generator selector switch and the mode switch 812 configure the circuit in series with the write "1" wave form generator 906, and a power reference selection switch 924 configures the comparator 826 to receive a write 1 power reference signal 924. When the WRITE CLOCK signal S2 is "1", a pulse is sent setting the flip-flop circuit 828. The flip-flop 828 sends a "1" output signal to the one-shot timer 830 and the write 1 wave form generator 906. The write "1" wave form generator 906 increases the voltage across the passive media 450 and the sense resistor 816 and the write 1 current limiting resistor 910. As the current increases the phase change layer begins to heat. The power calculated by the power calculator 822 increases, and at some time t, the calculated power is equal to the write "1" power reference signal 924. When the power reference 924 no longer exceeds the power applied to the passive media 450, the power comparator 826 sends a pulse resetting the flip-flop 828. The flip-flop sends a signal ramping down the write "1" wave form generator and provides a pulse as clock input to the one-shot circuit. The one-shot circuit, enabled by the true value of the WRITE DATA signal S4 and WRITE signal S6, sends a signal activating a clamp 834 which short circuits the voltage source to the tips through the circuit. By shorting the tip voltage source, current no longer flows through the passive media 450, and the phase change layer quickly cools. The speed with which the phase change layer cools leaves the phase bit in an amorphous state, thus creating a "1". Note that for circuits of FIGS. 9-12, as with FIG. 8, ramping is not required. In other embodiments the voltage can be pulsed across the circuit. Similarly, the wave form produced by he wave form generators can vary. For example, the waveform can be triangular or saw-tooth.

When the WRITE signal is "1" and the WRITE DATA input signal S4 is "0", the circuit is configured so that the write "0" wave form generator 940 is in series with a write 0 current limiting resistor 944, the passive media 450, and the tip 542. When the WRITE CLOCK signal S2 provides a pulse and sets the flip-flop 828, the flip-flop circuit sends a "1" output signal to the one-shot timer and the wave form generators. The write 0 wave form generator increases the voltage across the media and the sense resistor 816 and the write 0 current limiting resistor 944. In one embodiment, the write 0 wave form generator can be a higher voltage source than the write 1 wave form generator, creating a larger voltage potential across the circuit and increasing current. As the current increases the passive media 450 begins to heat. When the phase change layer is in a high resistance state (i.e., an amorphous state), the voltage across the phase change layer must exceed a threshold voltage, whereby the phase change layer enters a negative resistance mode, as shown in FIG. 5. The resistance of the phase change layer continues to change as it heats. When the phase change layer reaches a semi-molten state, the voltage current curve merges with the voltage-current curve of the low resistance, crystalline material (once the material is semi-molten or molten, the phase change layer is neither crystalline or amorphous). The calculated power increases as the voltage and current increase, and at some time t2, the calculated power is equal to the write 0 power reference 946. When the power reference signal 946 no longer exceeds the power applied to the passive media 450, the power comparator 826 sends a pulse resetting the flip-flop 828. The flip-flop 828 sends a signal slowly ramping down the write "0" wave form generator 940 and provides a pulse as clock input to the one-shot circuit 830. The output of the one-shot circuit 830, disabled by the false value of the WRITE DATA signal S4, continues to be "0". As the phase change layer slowly cools, the heated medium crystallizes, creating a "0". When writing a "0", a lower power reference is used, and once the power level is reached the voltage is ramped down slowly so that the media still has power in a diminishing amount with time, allowing the phase change layer to cool at a sufficiently slow rate to crystallize.

As in the previous embodiment, when the WRITE signal S6 is false the flip-flop 828 is in a clear state, ignoring all inputs. The mode switch 812 configures the circuit so that the read voltage source 802 is in series with a read limiting resistor 804, the sense resistor 816, and the grounded, passive media 450. The voltage across the passive media 450 draws a relatively small amount of current, insufficient to change the material properties of the phase change layer, but sufficient to allow the second amplifier 820 to measure the voltage drop across the passive media 450 and send the output as ANALOG READ DATA signal 832 to a read circuit (not shown). The read voltage should be sufficiently low such that the portion through which the voltage is applied does not undergo a phase change as a result of the application of the voltage. In an embodiment, the read voltage is typically less than 1 volt, acting as a current source with a voltage ceiling (the read voltage can vary with stack composition of the media device 450, and generally can be less than 0.8 volts across the chalcogenide material). Reading the media at lower voltages can limit a "tunneling effect" to a smaller tip region close to the media and can provide better resolution. In other embodiments the read voltage can be higher than 1 volt. Where the phase change layer is amorphous, the resistivity of the phase change layer is higher (i.e., in some embodiments on the order of four orders of magnitude higher than the crystalline material) resulting in a larger, detectable voltage drop between the voltage source and the passive media 450. Where the phase change layer is crystalline, the resistivity of the phase change layer is lower.

Figure 10:
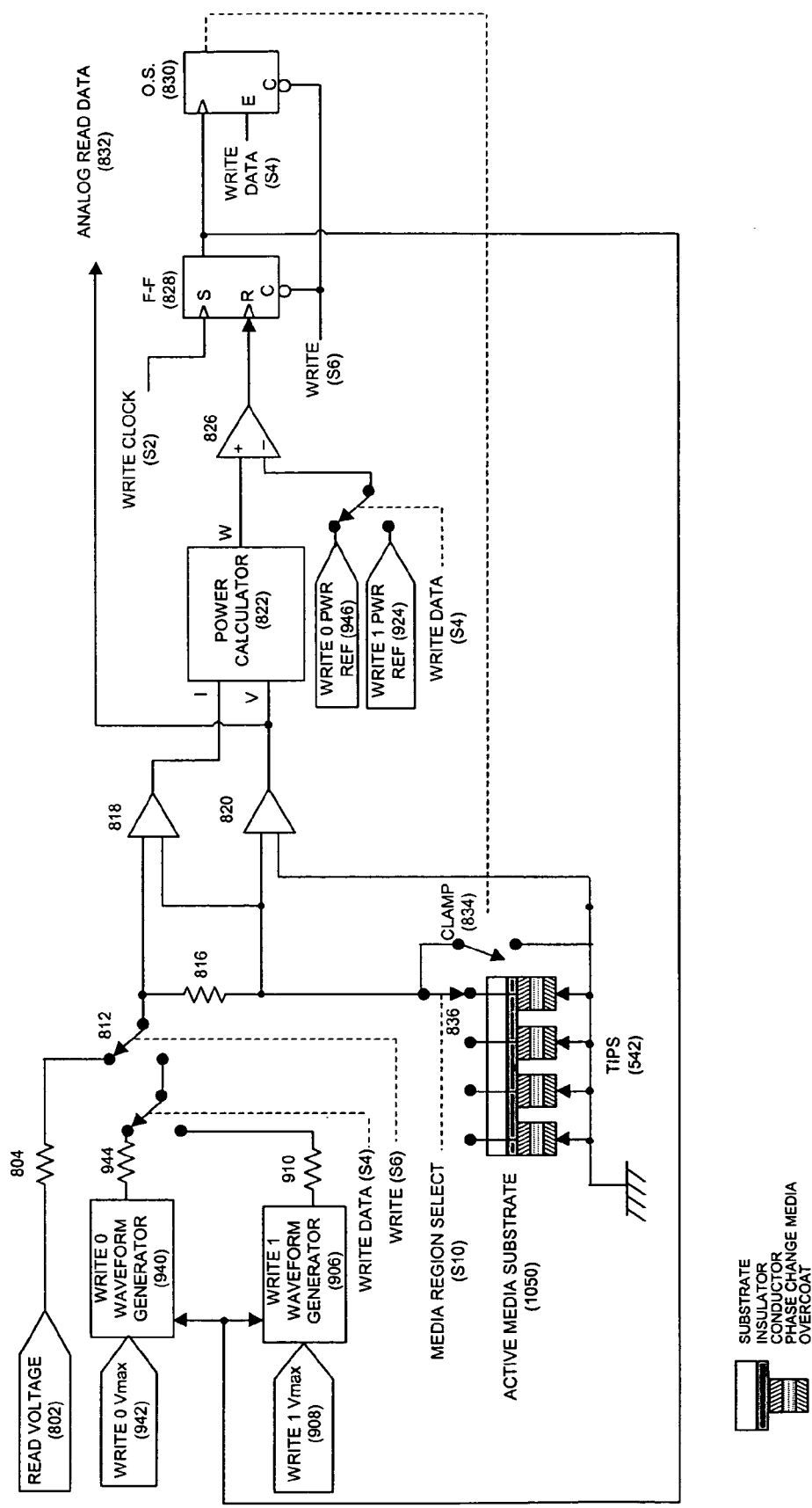
FIG. 10 is a circuit diagram of a read/write circuit in accordance with still another embodiment of the present invention including a plurality of active media regions.

FIG. 10 is a circuit diagram of still another embodiment of a circuit in accordance with the present invention. In such an embodiment, the read/write circuitry is associated with the media platform and passive tips 442 provide a ground path for current flowing through the circuit 1000. The media is "active" rather than "passive" and media islands are isolated from one another, as shown in the media cell of FIG. 3. The media regions can be isolated from one another by insulating regions using standard semiconductor processing techniques (e.g., trench etch and deposition, etc.). Use of active media regions allows all tips to be connected in common, thus potentially reducing the number of leads necessary to the tip platforms. As described below, use of active media regions also permits platform bussing, and thus further reductions in interconnects and read/write circuitry. The active media 1050 comprises a film stack including an insulator deposited or grown on the substrate, a conductor, a phase change layer, and optionally an over-layer grown or deposited on the insulator. The conductor, phase change layer, and over-layer (where present) are isolated media regions, electrically connected to the media platform read/write circuitry (e.g., by etching contacts or vias prior to forming the conductive layer). The read/write circuitry can selectively activate a media region, for example by a transmission gate, completing a circuit between a voltage source and a passive tip 442 in contact or near contact with the media. The read/write circuitry is arranged, for example, as described in FIGS. 8 and 9, however when the one-shot timer 830 activates the clamp, an electrical path is formed between the voltage source and the grounded tip platform and stored charge is drawn sharply from the phase change layer through the conductor and to the substrate. This allows the media to cool rapidly through conduction and convection and leaves the region in an amorphous state.

Figure 11:
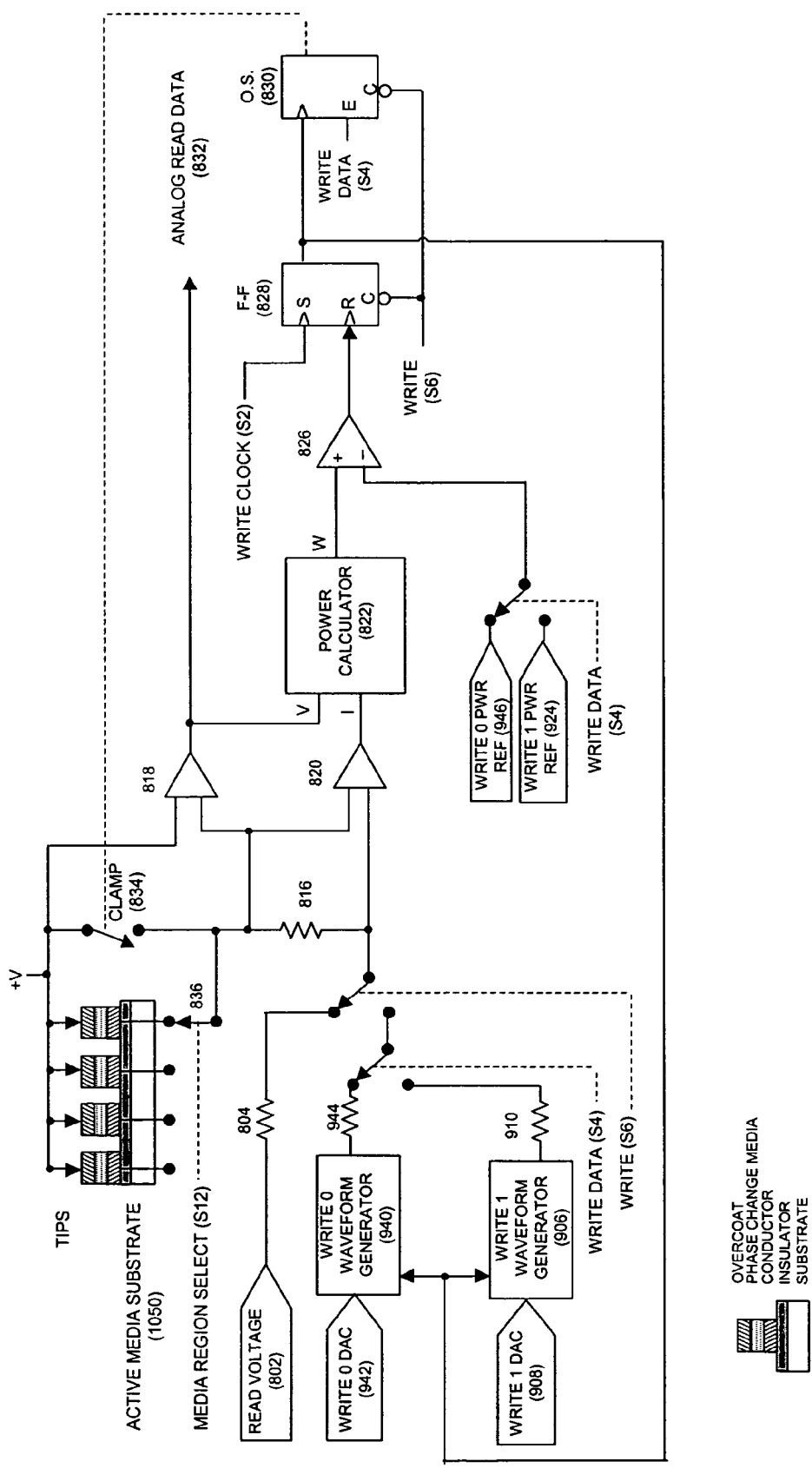
FIG. 11 is a circuit diagram of a read/write circuit in accordance with still another embodiment of the present invention including a plurality of active media regions.

The circuit diagrams illustrated and described above are exemplary and can include myriad different variations. The scope of the present invention is not intended to be limited to exemplary circuits described herein. For example, FIG. 11 is a circuit diagram of a circuit in accordance with still another embodiment, the circuit including an active media and read/write circuitry associated with the media platform, as described in reference to FIG. 10; however, a voltage is commonly applied to tips connected with one or more platforms. In this embodiment the write wave form generators 940,906 and the read voltage DAC sink rather than source the current. When the clamp is applied the tip is directly shorted to the media substrate.

Figure 12:
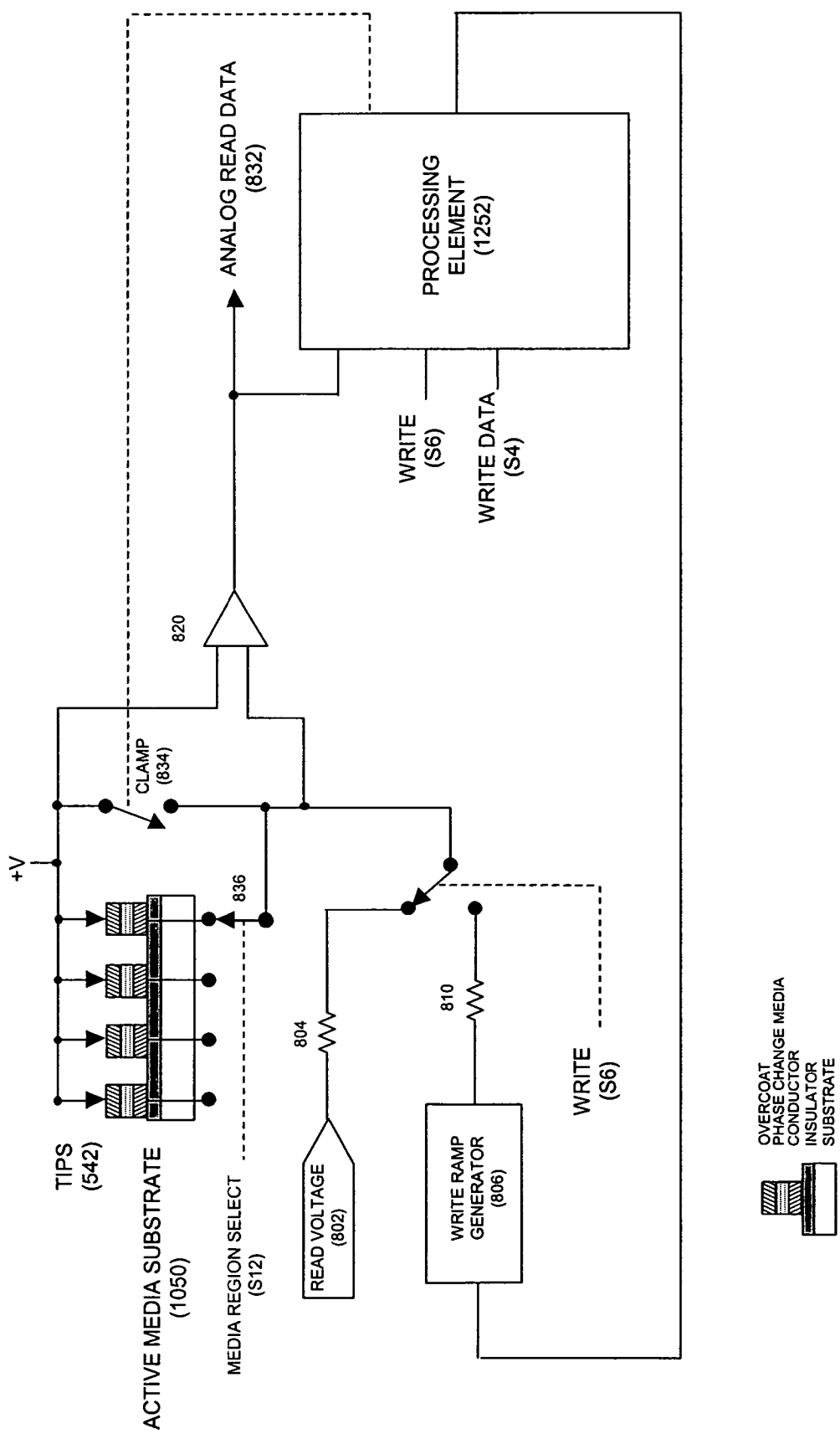
FIG. 12 is a circuit diagram of a read/write circuit in accordance with still another embodiment of the present invention including a plurality of active media regions and a processing element.

In still more embodiments, the circuit can be simplified by integrating portions of the circuit into a single processing element, for example such as application specific integrated circuit (ASIC), and enabling an adaptive feedback circuit (rather than an open loop circuit, as described above). FIG. 12 illustrates such an embodiment, wherein a power calculator, comparator, flip-flop circuit, and one-shot timer can be integrated into a single processing element. A WRITE signal can configure the circuit such that a write wave form generator 806 is in series with a write current limiting resistor 810, an active media region 1050, and a tip 542. A WRITE DATA signal S4 is received by the processing element 1252, which configures the write wave form generator 806 to apply an increase in voltage in accordance with an action of the circuit. When the processing element 1252 determines that sufficient power (or energy) has been applied to achieve a phase change in the phase change layer 450, the processing element provides an output signal to a clamp 834 to short circuit the active media region 1050. The processing element 1252 can constantly monitor the resistance of the phase change layer 450 and adjust the write waveform and power levels. Should a bit cell already contain a data bit equivalent to the one to be written, the processing element 1252 could optionally not initiate any current flow through the tip for that bit cell.

In one embodiment, the processing element can be a very fast processor that, for example, performs a table lookup and generates a write waveform that is a function of the voltage across the media tip or the current through the tip, rather than generating a fixed wave form for writing a "1" or a "0". The processor could apply a complex transfer function. The phase change layer is described in simple, uniform terms above, however, the phase change layer characteristics can vary across the film with grain boundary regions, nonuniformity, etc. By generating a write waveform that is a function of the characteristics of the media, the processor provides the ability to read the current voltage or resistance before writing so that the write waveform generated is suited to the state of the media prior to writing. Further, the write waveform can be modified during the write depending on what it experiences. The processor can measure the effectiveness of the write afterwards and memorize a running history of how the active media region measures so that, for example, the tip can attempt to write to a portion of the media with a given set of characteristics. If the desired results are not achieved, the process can be reiterative, with the processing element modifying current, and/or wave shapes in order to optimize the final result. Such a circuit is adaptive to characteristics of the media and/or a tip, and can be particularly beneficial where such characteristics include a great deal of variability.

Active Media Region Selection/Interconnect Reduction

Figure 13:
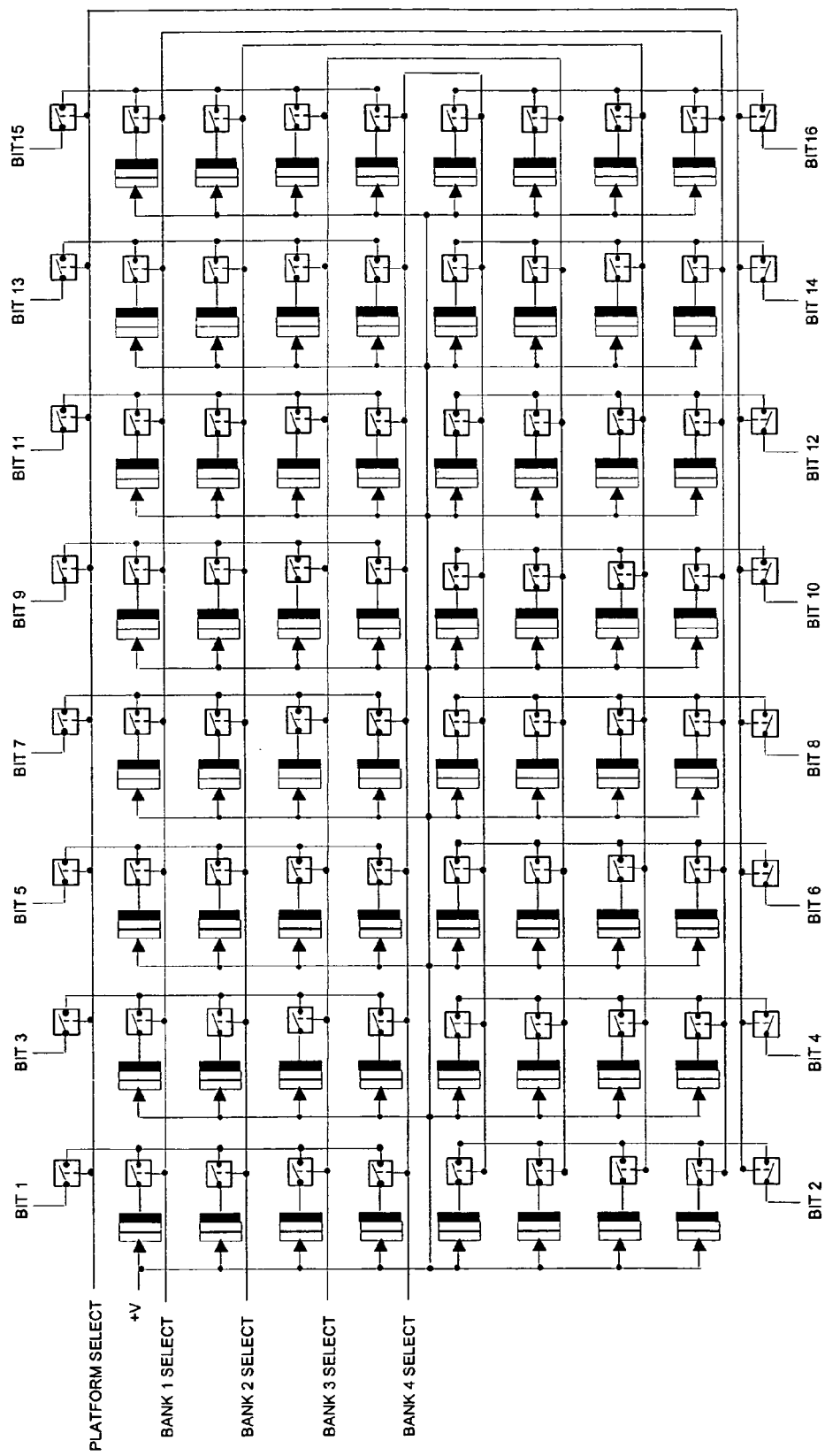
FIG. 13 is a circuit diagram of an active media platform in accordance with an embodiment of the present invention.

FIG. 13 is a circuit diagram of an exemplary media platform in accordance with one embodiment of the present invention. The exemplary media platform comprises 64 active media regions. Each active media region is associated with a corresponding tip from a tip platform, the corresponding tip being positionable within the active media region by actuating one or both of the media and tip platform. The active media region can be sized, in one embodiment, as a 100 μm×100 μm square. If the tip is capable of writing a 20 nm bit, the active media region is capable of storing $25 \times 10^6$ bits—i.e., approximately 3 MB—packed side-by-side. A portion of each active media region can be dedicated to servos, headers and gap, for example 10%. The tip platform can rely on clocking and a servo scheme, for example as known in the art, to position a tip over a desired bit.

The active media regions of the exemplary platform are each associated with one of 16 bit-lines 1372 and one of four banks 1370. Each bit-line 1372 is associated with a read/write circuit, and is connected with the exemplary platform when a transmission gate 836 is closed and the media platform is active. The transmission gate controls the current source or the ground plane underneath each media region. This is made possible by a discontinuous ground plane. Rather than using a common ground plane, for example as in the embodiment illustrated in FIG. 8 and 9, the ground plane is selectably activated. Each bank 1370 is associated with one active media region from each of the 16 bit-lines 1372. As can be seen in FIG. 1, a die having interconnect nodes 102 for each required signal can become extremely dense with wiring. As can be seen, each platform of the exemplary die includes sixteen tips. Each tip is individually addressed, therefore each platform includes sixteen wires. Further, each actuator includes a dual wire ground created eight additional wires for each platform. In a die 100 having sixteen platform, this results in 384 separate interconnect nodes 102 in an approximately 10 mm space and/or 384 separate read/write circuits—a complicated package and/or chip to manufacture. The problem is exacerbated with platforms having 64 tips, and 1152 interconnects are required for a sixteen cell die.

Methods and systems in accordance with the present invention can comprise selectable banks 1370 for accessing groups of (or individual) tips. The banks 1370 can reduce the complexity of read/write circuitry, and the number of interconnects between the platform and the read/write circuitry by activating only one of the active media regions for each bit-line. A supervisor processor controls the memory system and provides a signal to one of the banks 1370 closing the media region select switch (i.e., the transmission gate) 836 associated with a corresponding active media region for each of the bit-lines 1372, completing the circuit between the bit-line 1372 and the active-media region, as described above in reference to FIG. 10-12. The transmission gates 836 thus allow electronic tip selection by controlling the current flow or the ground plane beneath the media region. The tips can be connected with a common voltage source or sinked to a common ground, reducing the complexity of the read/write engine (the die comprising tip platforms). The transmission gates 836 can be formed, for example, beneath the media regions on the media die.

Figure 14:
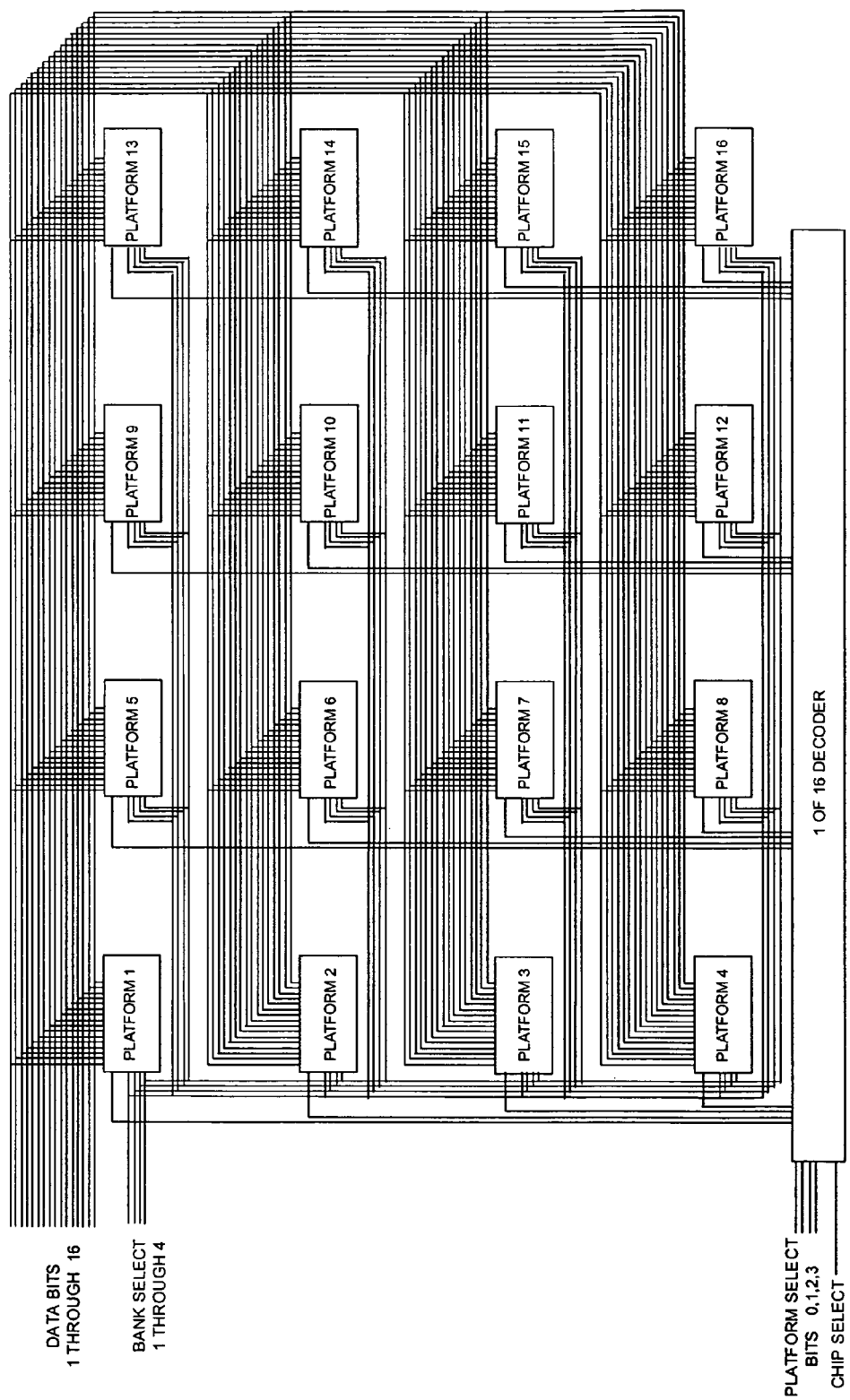
FIG. 14 is a circuit diagram of a die in accordance with an embodiment of the present invention having a plurality of the active media platforms of FIG. 13.

FIG. 14 is a circuit diagram of a single memory chip comprising 16 platforms. Each media platform is connected with the 16 bit-lines, but only one platform is active at a time. The active platform is activated by a decoder (i.e., a multiplexer or demultiplexer) that receives input from four platform select bits, and selects the appropriate media platform. A plurality of chips can be bussed (connected in common with the 16 bit-lines) and controlled by a single supervisor processor. Further, the bank select and platform select signals from the supervisor processor can be bussed, so that only a corresponding chip select signal need by uniquely routed to each chip. Thus, the supervisor processor can select the bank and platform, and select the chip to determine which of the 16 tips from which to receive data. Further, signals from the supervisor processor are sent to the platform to position the media platform relative to the tip platform, thereby selecting a desired bit within the active media region. Each exemplary chip includes 16 platforms having four actuators, therefore each exemplary chip includes 64 actuators. The actuators signals are multiplexed, and based on the bank and platform select signals.

Figure 15:
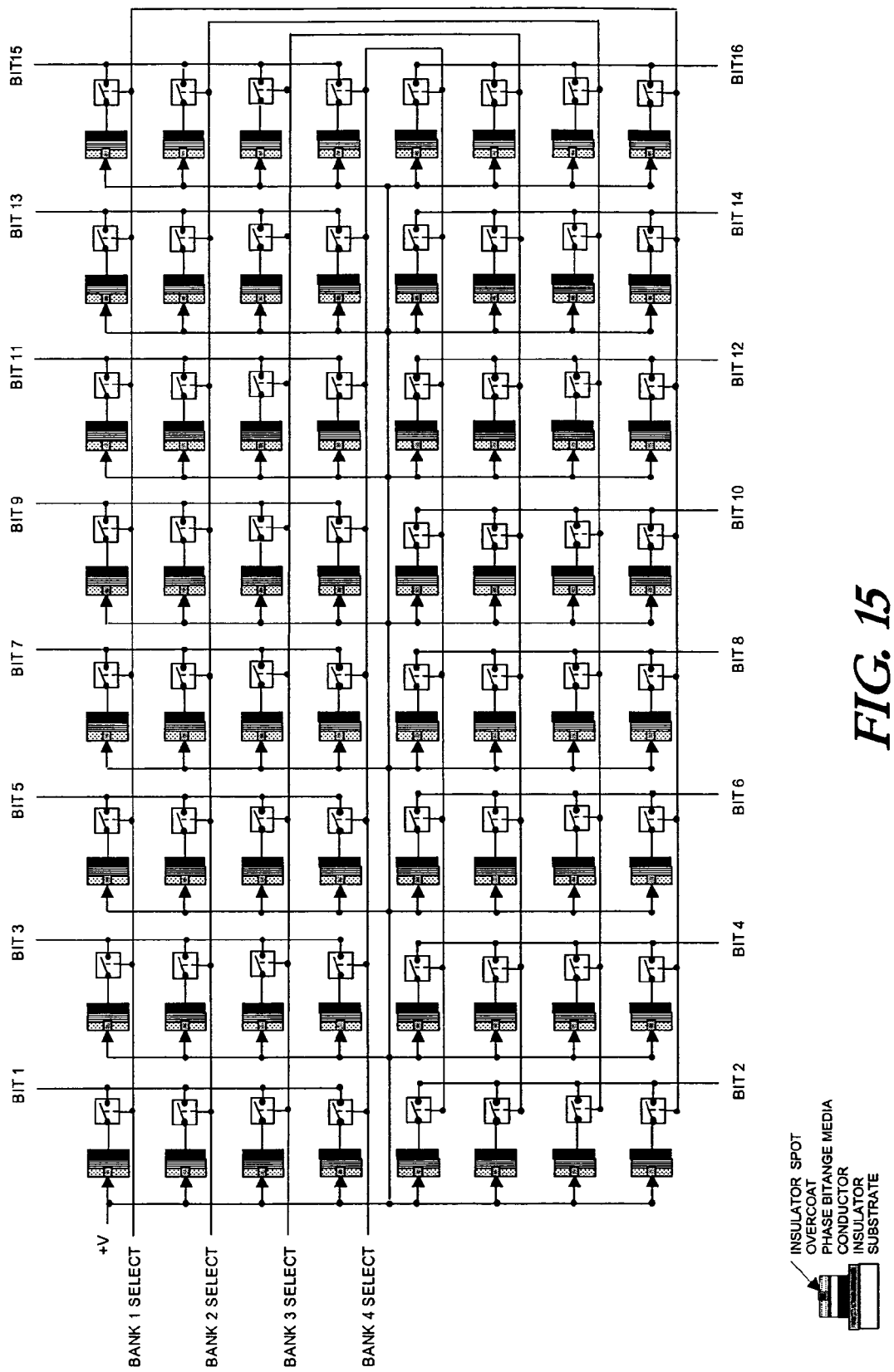
FIG. 15 is a circuit diagram of an active media platform in accordance with an alternative embodiment of the present invention, the active media platform including a plurality of dead spots.

FIG. 15 is a circuit diagram of an alternative embodiment of a media platform in accordance with the present invention. Each active media region includes an insulated portion, or dead spot isolation region. The dead spots can be formed in the film stack of the active media using different techniques. For example, the dead spot can be formed by partially etching the film stack, filling the etched portion with an oxide, and polishing the film stack using chemical-mechanical polishing (CMP). Alternatively, nitride can be deposited on the film stack, a portion of the film stack can be etched to form dead spots, a thermal oxide can be grown in the etched portions, and the nitride can be stripped. Myriad different manufacturing techniques can be applied to form an insulated isolation region within or on a conductive material. One of ordinary skill in the art can appreciate the different methods for forming features in a film stack. In one embodiment, the dead spot is an indentation in the film stack surface, such that a tip rests in the spot. The tip can rest in the shallow depression until the actuators of an associated tip platform (or a corresponding media platform) are activated. A platform positioned such that the tips rest in dead spots in the active media region is isolated from the bit-lines, therefore a platform select signal is not required, and the circuitry is simplified. The actuator signals are separately controlled, and either the media platform or the tip platform is controlled. When the platform is repositioned off-center a circuit is completed between the tip and the bit-line.

Each insulated portion can be a relative small portion within the active media region. The insulated portion is sized according to manufacturing tolerances of the platforms and/or tips, thermal expansion of each platform relative to one another, etc., and in one embodiment can comprise a 5 μm×5 μm square. An isolation region of that size within a 100 μm×100 μm active media region consumes only 0.25% of the active media region surface.

Figure 16:
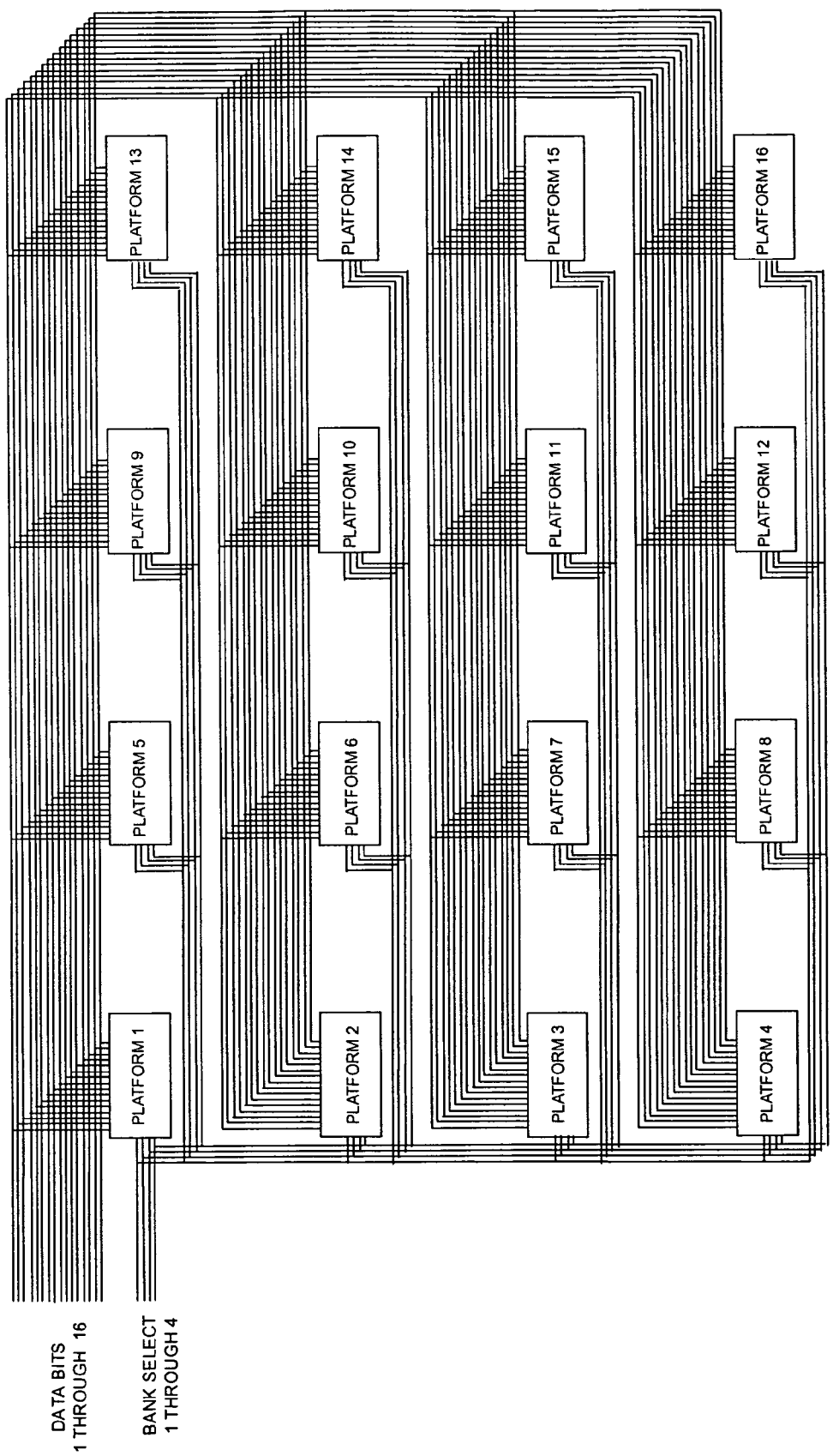
FIG. 16 is a circuit diagram of a die in accordance with an embodiment of the present invention having a plurality of the active media platforms of FIG. 15.

FIG. 16 is a circuit diagram of an alternative embodiment of a single memory chip comprising 16 platforms, with each platform including active media regions having dead spots. Only one platform is active at a time, because only one platform is positioned off of the dead spot. The decoder of FIG. 14 and the chip select signal is no longer required. A plurality of chips can be bussed, connecting the 16 bit-lines and bank select signals in common. Further, the bank select and platform select signals from the supervisor processor can be bussed, so that only a corresponding chip select signal need by uniquely routed to each chip. Thus, the supervisor processor can select the bank and platform, and select the chip to determine which of the 16 tips from which to receive data. Further, signals from the supervisor processor are sent to the platform to position the media platform relative to the tip platform, thereby selecting a desired bit within the active media region. Each exemplary chip includes 16 platforms having four actuators, therefore each exemplary chip includes 64 actuators. The actuators signals are multiplexed, and based on the bank and platform select signals.

The foregoing description of the present invention have been presented for purposes of illustration and description. It is not intended to be exhaustive or to limit the invention to the precise forms disclosed. Many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

The invention claimed is:

1. A method of storing information, comprising:
    using a media, the media including:
        a conductive under-layer;
        an over-layer; and
        a phase change layer disposed between the conductive under-layer and the over-layer;
    using a tip including a distal end generally having a radius of curvature;
    positioning the tip in proximity to the media such that a current can flow between the tip and the media;
    applying the current between the tip and the media so that a portion of the phase change layer is heated to at least a threshold temperature;
    focusing the current so that the portion is narrower in width than the radius of curvature of the distal end;
    removing the current from between the tip and the media; and
    cooling the portion so that an indicia is formed within the portion.

2. The method of claim 1, wherein the over-layer is a conductive material that conducts better through the over-layer than across the over-layer.

3. The method of claim 1, wherein the over-layer is a conductive material that has a higher conductivity along a plane substantially perpendicular to a surface of the media than along a plane substantially parallel to a surface of the media.

4. The method of claim 1, wherein the over-layer is an anisotropic columnar material.

5. The method of claim 4, wherein the over-layer is titanium nitride.

6. The method of claim 4, wherein the over-layer is microcrystalline silicon.

7. The method of claim 1, wherein:
    the phase change layer has an initial structure, the initial structure being a crystalline structure;
    removing the current includes directing the current away from the phase change layer; and
    the indicia has an amorphous structure.

8. The method of claim 1, wherein:
    the phase change layer has an initial structure, the initial structure being an amorphous structure; and
    the bit has a crystalline structure.

9. The method of claim 7, wherein the phase change layer is a chalcogenide.

10. The method of claim 1, wherein applying a current between the tip and the media includes applying a voltage potential across the tip and the media.

11. The method of claim 10, wherein the voltage potential is applied as a waveform.

12. The method of claim 11, wherein the waveform is one of a pulse, a triangle, a saw-tooth, and a trailing edge.

13. The method of claim 7, further comprising:
    applying a second current between the tip and the media so that the portion is heated to a crystalline temperature; and
    removing the second current from between the tip and the media; and
    cooling the portion so that the portion is substantially crystalline in structure.

14. The method of claim 13, wherein applying a second current between the tip and the media includes applying a second voltage potential across the tip and the media.

15. The method of claim 14, wherein the voltage potential is applied as a waveform.

16. The method of claim 15, wherein the waveform is one of a pulse, a triangle, a saw-tooth, and a trailing edge.

17. The method of claim 8, further comprising:
    applying a second current between the tip and the media so that the portion is heated to a threshold temperature; and
    removing the second current from between the tip and the media;
    quenching the portion so that the portion is substantially amorphous in structure.

18. The method of claim 17, wherein applying a second current between the tip and the media includes applying a second voltage potential across the tip and the media.

19. The method of claim 18, wherein the voltage potential is applied as a waveform.

20. The method of claim 19, wherein the waveform is one of a pulse, a triangle, a saw-tooth, and a trailing edge.

21. The method of claim 1, wherein focusing the current includes:
applying the current so that a portion of the current flowing between the tip and the media decreases as the radius of curvature curves away from the media; and
allowing the current to be at least partially confined by the over-layer so that a flow of the current is substantially columnar.

22. A method of storing information in a media including a conductive under-layer, an over-layer, and a phase change layer disposed between the conductive under-layer and the over-layer, the method comprising:
positioning a tip having a radius of curvature in proximity to the media such that a current can flow between the tip and the media;
applying the current between the tip and the media so that a portion of the phase change layer is heated to a threshold temperature;
focusing the current so that the portion is narrower in width than the radius of curvature of the tip;
removing the current from between the tip and the media; and
quenching the portion so that an indicia is formed within the portion.

23. A computer readable media having instruction to perform the steps of:
positioning a media, the media including:
a conductive under-layer;
an over-layer; and
a phase change layer disposed between the conductive under-layer and the over-layer;
positioning a tip having a radius of curvature in proximity to the media such that a current can flow between the tip and the media;
applying the current between the tip and the media so that a portion of the phase change layer is heated to one of a molten and semi-molten state;
focusing the current so that the portion is narrower in width than the radius of curvature of the tip; and
removing the current from between the tip and the media; and
quenching the portion so that a bit is formed within the portion.

24. A method of storing information, comprising:
using a media, the media including:
a conductive under-layer;
an over-layer having a higher conductivity through the over-layer than across the over-layer; and
a phase change layer disposed between the conductive under-layer and the over-layer;
positioning a tip in proximity to the media such that a current can flow between the tip and the media;
applying the current between the tip and the media;
focusing the current so that a portion of the phase change layer narrower in width than the tip is heated to a threshold temperature;
removing the current from between the tip and the media; and
quenching the portion so an indicia is formed within the portion.

25. The method of claim 24, wherein the over-layer is one of titanium nitride and microcrystalline silicon.

26. The method of claim 24, wherein:
the phase change layer has an initial structure, the initial structure being crystalline; and
the crystalline structure has a bulk resistivity.

27. The method of claim 26, wherein the indicia has a resistivity different from the bulk resistivity.

28. The method of claim 27, wherein the indicia comprises one of a plurality of states.

29. The method of claim 28, wherein a state includes a range of resistivity values.

30. The method of claim 27, wherein the indicia comprises one of a plurality of ranges of resistivity values.

31. The method of claim 24, wherein the phase change layer is a chalcogenide.

32. The method of claim 24, wherein applying a current between the tip and the media includes applying a voltage potential across the tip and the media.

33. The method of claim 32, wherein the voltage potential is applied as a waveform.

34. The method of claim 33, wherein the waveform is one of a pulse, a triangle, a saw-tooth, and a trailing edge.

35. The method of claim 24, wherein focusing the current includes allowing the current to be at least partially confined by the over-layer so that a flow of the current is substantially columnar.

36. The method of claim 24, wherein:
the tip includes a radius of curvature;
focusing the current includes one or both of:
applying the current so that the current flowing between the tip and the media decreases as the radius of curvature curves away from the media; and
allowing the current to be at least partially confined by the over-layer so that a flow of the current is substantially columnar.

37. A method of forming an indicia in a data storage device, comprising:
positioning a terminus of a tip in electrical communication with a surface of a media having a conductive under-layer, an over-layer, and a phase change layer disposed between the conductive under-layer and the over-layer;
applying a current between the terminus and the media so that a portion of the phase change layer is heated to a threshold temperature;
confining the current so that the portion is narrower in width than the terminus;
removing the current from the media; and
quenching the portion so that information is formed within the portion.

38. The method of claim 37, wherein:
the terminus includes a radius of curvature; and
confining the current includes one or both of:
limiting a magnitude of the current so that a portion of the current flowing between the terminus and the media decreases as the radius of curvature curves away from the media; and
allowing the current to be at least partially confined by the over-layer so that a flow of the current is substantially columnar.

39. The method of claim 37, wherein confining the current includes allowing the current to be at least partially confined by the over-layer so that a flow of the current is substantially columnar.

40. The method of claim 37, wherein the over-layer is a conductive material that conducts better through the over-layer than across the over-layer.

41. The method of claim 40, wherein the over-layer is one of titanium nitride and microcrystalline silicon.

42. The method of claim 37, wherein:
the phase change layer has an initial structure;
the initial structure is crystalline; and
the crystalline material has a bulk resistivity.

43. The method of claim 42, wherein the information has a resistivity different from the bulk resistivity.

44. The method of claim 43, wherein the information has one of a plurality of states.

45. The method of claim 44, wherein a state includes a range of resistivity values.

46. The method of claim 37, wherein the information comprises one of a plurality of ranges of resistivity values.

47. The method of claim 37, wherein the phase change layer is a chalcogenide.

48. The method of claim 37, wherein applying a current between the tip and the media includes applying a voltage potential across the tip and the media.

49. The method of claim 48, wherein the voltage potential is applied as a waveform.

50. The method of claim 49, wherein the waveform is one of a pulse, a triangle, a saw-tooth, and a trailing edge.

51. The method of claim 37, wherein the portion is heated to one of a molten and a semi-molten state.

52. A method of storing information in a media including a conductive under-layer, an over-layer, and a phase change layer disposed between the conductive under-layer and the over-layer, the method comprising:
positioning a tip in proximity to the media such that a current can flow between the tip and the media;
applying the current between the tip and the media so that a portion of the phase change layer is heated to a threshold temperature;
focusing the current so that the portion is narrower in width than the tip; and
removing the current from between the tip and the media; and
quenching the portion so that information is formed within the portion.

53. A method of storing information, comprising:
using a data storage device, the data storage including a media having a conductive under-layer, an over-layer, and a phase change layer disposed between the conductive under-layer and the over-layer; and
commanding the data storage device to write information so that the tip is positioned in proximity to the media such that a current can flow between the tip and the media, so that a current is applied between the tip and the media such that a portion of the phase change layer is heated to a threshold temperature, so that the current is focused such that the portion is narrower in width than the tip, and so that the current is removed from between the tip and the media thereby forming the information within the portion.

54. The method of claim 53, further comprising:
accessing the data storage device to read the information so that the tip is positioned in proximity to the media such that a current can flow between the tip and the media, and so that a current is applied between the tip and the media such that a resistivity of the portion can be detected.

55. The method of claim 53, wherein the over-layer is a conductive material that conducts better through the over-layer than across the over-layer.

56. The method of claim 55, wherein the over-layer is one of titanium nitride and microcrystalline silicon.

57. The method of claim 55, wherein the phase change layer has one of a crystalline structure and an amorphous structure, the phase change layer having a bulk resistivity.

58. The method of claim 55, wherein the phase change layer is a chalcogenide.

59. The method of claim 55, wherein when the current is applied between the tip and the media, a voltage potential is applied across the tip and the media.

60. The method of claim 59 wherein the voltage potential is applied as a waveform.

61. The method of claim 60 wherein the waveform is one of a pulse, a triangle, a saw-tooth, and a trailing edge.

62. A computer readable media having instruction to perform the steps of:
positioning a media, the media including:
a conductive under-layer;
an over-layer; and
a phase change layer disposed between the conductive under-layer and the over-layer;
positioning a tip in proximity to the media such that a current can flow between the tip and the media;
applying the current between the tip and the media so that a portion of the phase change layer is heated to a threshold temperature;
focusing the current so that the portion is narrower in width than the tip; and
removing the current from between the tip and the media so that information is formed within the portion.

63. A method of storing information, comprising:
using a media, the media including:
a quench layer;
a tunneling layer; and
a phase change layer disposed between the quench layer and tunneling layer;
positioning a tip in proximity to the media such that a current can flow between the tip and the media;
applying the current between the tip and the media;
focusing the current so that a portion of the phase change layer narrower in width than the tip is heated to a threshold temperature; and
removing the current from between the tip and the media so that information is formed within the portion.

64. The method of claim 63, wherein the tunneling layer is one of titanium nitride and microcrystalline silicon.

65. The method of claim 63, wherein the phase change layer has a structure that is one of crystalline and amorphous, the phase change layer having a bulk resistivity.

66. The method of claim 65, wherein the information is a resistivity different from the bulk resistivity.

67. The method of claim 66, wherein the information comprises one of a plurality of states.

68. The method of claim 67, wherein a state includes a range of resistivity values.

69. The method of claim 63, wherein the information comprises one of a plurality of ranges of resistivity values.

70. The method of claim 63, wherein the phase change layer is a chalcogenide.

71. The method of claim 63, wherein applying a current between the tip and the media includes applying a voltage potential across the tip and the media.

72. The method of claim 71, wherein the voltage potential is applied as a waveform.

73. The method of claim 72, wherein the waveform is one of a pulse, a triangle, a saw-tooth, and a trailing edge.

74. The method of claim 63, wherein the portion is heated to one of a molten and a semi-molten state.

75. The method of claim 63, wherein focusing the current includes allowing the current to be at least partially confined by tunneling layer so that a flow of the current is substantially columnar.

76. The method of claim 63, wherein:
the tip includes a radius of curvature;
focusing the current includes one or both of:
applying the current so that the current flowing between the tip and the media decreases as the radius of curvature curves away from the media; and allowing the current to be at least partially confined by the tunneling layer so that a flow of the current is substantially columnar.

77. A method of storing information in a phase change layer of a media device, the phase change layer having a bulk crystalline state and the information being indicated by one of a crystalline domain and an amorphous domain within the phase change layer, wherein a portion of the phase change layer is heated and subsequently cooled to form an amorphous domain by applying a current between a tip and the media device, the improvement comprising:

focusing the current so that the heated portion of the phase change layer is narrower in width than a radius of curvature of the tip.

78. A method of storing information in a phase change layer of a media device, the phase change layer having a bulk state and the information being indicated by one of a crystalline domain and an amorphous domain within the phase change layer, wherein a portion of the phase change layer is heated by applying a current between a tip and the media device, the improvement comprising:

focusing the current so that the heated portion of the phase change layer is narrower in width than a radius of curvature of the tip.

79. A method of storing information in a phase change layer of a media device, the phase change layer having a bulk state and the information being indicated by one of a crystalline domain and an amorphous domain within the phase change layer, wherein a portion of the phase change layer is heated by applying a current to the media device, the improvement comprising:

focusing the current by applying the current through an over-layer disposed on the phase change layer;

wherein the over-layer is a conductive material that conducts more efficiently through the over-layer than across the over-layer.

80. A method of storing information in a phase change layer of a media device, the phase change layer having a bulk state and the information being indicated by one of a crystalline domain and an amorphous domain within the phase change layer, wherein a portion of the phase change layer is heated by applying a current to the media device, the improvement comprising:

focusing the current by applying the current through an over-layer disposed on the phase change layer;

wherein the over-layer is a conductive material that has a higher conductivity along a plane substantially perpendicular to a surface of the media than along a plane substantially parallel to a surface of the media.

* * * * *